(12) United States Patent
An et al.

(10) Patent No.: US 12,185,602 B2
(45) Date of Patent: Dec. 31, 2024

(54) DISPLAY DEVICE

(71) Applicant: Samsung Display Co., Ltd., Yongin-Si (KR)

(72) Inventors: Jin Sung An, Yongin-si (KR); Sung Ho Kim, Yongin-si (KR); Yong Jae Kim, Yongin-si (KR); Yun Hwan Park, Yongin-si (KR); Yoon Jee Shin, Yongin-si (KR); Sug Woo Jung, Yongin-si (KR); Hyun Wook Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/437,088

(22) Filed: Feb. 8, 2024

(65) Prior Publication Data

US 2024/0179978 A1    May 30, 2024

Related U.S. Application Data

(63) Continuation of application No. 18/143,402, filed on May 4, 2023, now Pat. No. 11,937,476.

(30) Foreign Application Priority Data

Aug. 11, 2022  (KR) .......................... 10-2022-0100627

(51) Int. Cl.
   *H10K 59/131*   (2023.01)
   *G09G 3/3233*   (2016.01)
   *H10K 59/88*    (2023.01)

(52) U.S. Cl.
   CPC ......... *H10K 59/131* (2023.02); *G09G 3/3233* (2013.01); *H10K 59/88* (2023.02); *G09G 2300/0413* (2013.01); *G09G 2300/0426* (2013.01); *G09G 2300/0819* (2013.01); *G09G 2300/0861* (2013.01); *G09G 2310/02* (2013.01)

(58) Field of Classification Search
   None
   See application file for complete search history.

(56) References Cited

U.S. PATENT DOCUMENTS

| | | | | |
|---|---|---|---|---|
| 2008/0238817 A1* | 10/2008 | Mamba | ................ | G09G 3/3648 345/55 |
| 2024/0057411 A1* | 2/2024 | An | ...................... | H10K 59/131 |

FOREIGN PATENT DOCUMENTS

| | | |
|---|---|---|
| CN | 114258320 A | 3/2022 |
| KR | 10-2020-0031194 A | 3/2020 |
| KR | 10-2022-0042007 A | 4/2022 |

* cited by examiner

*Primary Examiner* — Stephen T. Reed
(74) *Attorney, Agent, or Firm* — Innovation Counsel LLP

(57) ABSTRACT

A display device comprises a substrate; a circuit array layer comprising pixel drivers, data lines, first dummy lines, and second dummy lines; and a light emitting array layer. The display area comprises middle, first side, and second side regions. The data lines comprise first, second, and third data lines disposed in the middle, first side, and second side regions, respectively. The first dummy lines comprise a first data detour line disposed in the first side region and adjacent to a part of the second data line, and auxiliary lines. The second dummy lines comprise a second data detour line configured to connect the first data detour line to the third data line, and additional lines. The auxiliary lines comprise a bias auxiliary line to which a bias power is applied; and a second power auxiliary line to which a second power is applied.

20 Claims, 17 Drawing Sheets

SEL: CH1, S1, D1, CH2, S2,D2, CH31, S31, D31,
CH32, S32, D32, CH41, S41, D41, CH5, S5, D5,
CH6, S6, D6, CH7, S7, D7, CH8, S8, D8
CDL1: SCWL, SCIL, BCL, ECL, G1, G2,
G31, G32, G41, G42, G5, G6, G7, G8

DISPLAY DEVICE

CROSS-REFERENCE TO RELATED APPLICATION

This application is a continuation application of U.S. patent application Ser. No. 18/143,402 filed on May 4, 2023, which claims priority to and the benefit of Korean Patent Application No. 10-2022-0100627 filed in the Korean Intellectual Property Office on Aug. 11, 2022, the disclosures of which are incorporated by reference herein in their entireties.

BACKGROUND

1. Technical Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The display device may include a display panel emitting light for image display and a driver supplying a signal or power for driving the display panel.

The display device may display an image on at least one surface. The display surface of the display device may include a display area in which a plurality of emission areas emitting light for image display are arranged, and a non-display area disposed around the display area.

The display device may include data lines for transmitting data signals to the plurality of emission areas and a display driving circuit for supplying data signals to the data lines.

SUMMARY

Data supply lines connecting the data lines to the display driving circuit are disposed in the non-display area. Accordingly, if the number of data lines increases to improve resolution, the width for the arrangement of the increased data supply lines increases and, thus, the width of the non-display area may increase.

In this case, the ratio of the display area on the display surface decreases, so that the display quality of the display device may deteriorate. That is, the ratio of the display area on the display surface may have a trade-off relationship with the resolution.

Aspects of the present disclosure provide a display device capable of reducing the width of a non-display area without affecting resolution.

According to an embodiment, a display device comprises a substrate comprising a main region and a sub-region protruding from one side of the main region. The main region comprises a display area in which a plurality of emission areas is arranged, and a non-display area disposed around the display area. A circuit array layer is disposed on the substrate and comprises a plurality of pixel drivers, data lines, first dummy lines, and second dummy lines. The plurality of pixel drivers respectively correspond to the plurality of emission areas. The data lines are configured to transmit data signals to the plurality of pixel drivers. The first dummy lines extend in the same direction as the data lines and are respectively adjacent to the data lines. The second dummy lines extend in a first direction intersecting the data lines. A light emitting array layer is disposed on the circuit array layer and comprises a plurality of light emitting elements respectively corresponding to the plurality of emission areas. The display area comprises a middle region adjacent to the sub-region in a second direction which is an extension direction of the data lines, a first side region in contact with the middle region in the first direction, and a second side region between the first side region and the non-display area. The data lines comprise a first data line disposed in the middle region; a second data line disposed in the first side region; and a third data line disposed in the second side region. The first dummy lines comprise a first data detour line disposed in the first side region and adjacent to a part of the second data line, and auxiliary lines other than the first data detour line. The second dummy lines comprise a second data detour line disposed in the first side region and the second side region and configured to connect the first data detour line to the third data line, and additional lines other than the second data detour line. The auxiliary lines comprise a bias auxiliary line to which a bias power is configured to be applied; and a second power auxiliary line to which a second power is configured to be applied, wherein a first power and the second power are for driving the light emitting elements.

At least one second power auxiliary line and at least one bias auxiliary line are alternately disposed in the first direction.

In the first side region, one auxiliary line spaced apart from one side of the first data detour line in the second direction is adjacent to another part of the second data line.

The circuit array layer further comprises first power additional lines disposed in the display area, extending in the first direction, and to which the first power is configured to be applied. The first power additional lines and the second dummy lines are alternately disposed.

The second data detour line is adjacent to each of the first power additional lines. one of the first power additional lines is adjacent to the second data detour line and two additional lines spaced apart side by side on both sides of the second data detour line in the first direction.

The additional lines comprise a bias additional line to which the bias power is configured to be applied; and a second power additional line to which the second power is configured to be applied.

The circuit array layer further comprises data supply lines configured to electrically connect the data lines to a display driving circuit disposed in the sub-region, respectively. The data supply lines comprise a first data supply line extending to the middle region, and a second data supply line and a third data supply line extending to the first side region. The first data line is electrically connected to the first data supply line. The second data line is electrically connected to the second data supply line. The first data detour line is electrically connected to the third data supply line. The third data line is electrically connected to the third data supply line through the first data detour line and the second data detour line.

The circuit array layer further comprises a bias supply line extending from the sub-region to the non-display area and configured to transmit the bias power; a first power supply line extending from the sub-region to the non-display area and configured to transmit the first power; and a second power supply line extending from the sub-region to the non-display area and configured to transmit the second power. The bias auxiliary line and the bias additional line are electrically connected to the bias supply line. The first power additional lines are electrically connected to the first power supply line. The second power auxiliary line and the second power additional line are electrically connected to the second power supply line.

The circuit array layer is provided to include a structure comprising a semiconductor layer on the substrate; a first conductive layer on a first gate insulating layer covering the semiconductor layer; a second conductive layer on a second gate insulating layer covering the first conductive layer; a third conductive layer on an interlayer insulating layer covering the second conductive layer; a fourth conductive layer on a first planarization layer covering the third conductive layer; and a fifth conductive layer on a second planarization layer covering the fourth conductive layer. The data lines and the first dummy lines are included in the fifth conductive layer. The second dummy lines and the first power additional lines are included in the fourth conductive layer. The second power auxiliary line is electrically connected to the second power additional line through a first dummy contact hole extending through the second planarization layer.

The circuit array layer further comprises a bias line included in the second conductive layer, configured to electrically connect the bias supply line to the plurality of pixel drivers, and extending in the first direction. The bias line is electrically connected to a bias connection electrode included in the third conductive layer through a first bias connection hole extending through the interlayer insulating layer. The bias additional line, which is a part of the second dummy lines, is electrically connected to the bias connection electrode through a second bias connection hole extending through the first planarization layer. The bias auxiliary line is electrically connected to the bias additional line through a second dummy contact hole extending through the second planarization layer.

The circuit array layer further comprises a first power line configured to electrically connect the plurality of pixel drivers to the first power supply line. The first power line comprises a first power sub-line included in the second conductive layer and extending in the first direction; and a first power main line included in the third conductive layer, extending in the second direction, and electrically connected to the first power sub-line and the first power additional line.

The circuit array layer further comprises a scan write line configured to transmit a scan write signal to the plurality of pixel drivers; a scan initialization line configured to transmit a scan initialization signal to the plurality of pixel drivers; an emission control line configured to transmit an emission control signal to the plurality of pixel drivers; a bias control line configured to transmit a bias control signal to the plurality of pixel drivers; a gate initialization voltage line configured to transmit a first initialization voltage to the plurality of pixel drivers; and an anode initialization voltage line configured to transmit a second initialization voltage to the plurality of pixel drivers. Anode electrodes of the plurality of light emitting elements are respectively connected to the plurality of pixel drivers. Cathode electrodes of the plurality of light emitting elements are electrically connected to the second power supply line. One pixel driver of the plurality of pixel drivers comprises a first transistor configured to generate a driving current for driving the light emitting element based on a data signal through one of the data lines; a second transistor disposed between the one data line and a first electrode of the first transistor, and configured to transmit the data signal through the one data line to the first electrode of the first transistor based on the scan write signal; a third electrode disposed between a gate electrode of the first transistor and a second electrode of the first transistor, and configured to connect the gate electrode of the first transistor to the second electrode of the first transistor based on the scan control signal; a fourth transistor disposed between the gate initialization voltage line and the gate electrode of the first transistor, and configured to transmit the first initialization voltage to the gate electrode of the first transistor based on the scan initialization signal; a fifth transistor disposed between the first power line and the first electrode of the first transistor and configured to transmit the first power to the first electrode of the first transistor based on the emission control signal; a sixth transistor disposed between the anode electrode of one light emitting element of the light emitting elements and the second electrode of the first transistor, and configured to connect the second electrode of the first transistor to the anode electrode of the one light emitting element based on the emission control signal; a seventh transistor disposed between the anode initialization voltage line and a second electrode of the sixth transistor, and configured to transmit the second initialization voltage to the second electrode of the sixth transistor based on the bias control signal; and an eighth transistor disposed between the bias line and the first electrode of the first transistor, and configured to transmit the bias voltage to the first electrode of the first transistor based on the bias control signal. The scan write line, the scan control line, the scan initialization line, the emission control line, and the bias control line extend in the first direction and are included in the first conductive layer. A channel, a first electrode, and a second electrode of each of the first transistor, the second transistor, the third transistor, the fourth transistor, the fifth transistor, the sixth transistor, the seventh transistor, and the eighth transistor are included in the semiconductor layer. The gate electrode of the first transistor is included in the first conductive layer. The gate electrode of the second transistor and the gate electrode of the third transistor are different parts of the scan write line. The gate electrode of the fourth transistor is a part of the scan initialization line. The gate electrode of the fifth transistor and the gate electrode of the sixth transistor are different parts of the emission control line. The gate electrode of the seventh transistor and the gate electrode of the eighth transistor are different parts of the bias control line.

According to an embodiment, a display device comprises a substrate comprising a main region and a sub-region protruding from one side of the main region. The main region comprises a display area in which a plurality of emission areas are arranged and a non-display area disposed around the display area. A circuit array layer is disposed on the substrate and comprises a plurality of pixel drivers, data lines, first dummy lines, and second dummy lines. The plurality of pixel drivers respectively corresponding to the plurality of emission areas. The data lines are configured to transmit data signals to the plurality of pixel drivers. The first dummy lines extend in the same direction as the data lines and are respectively adjacent to the data lines. The second dummy lines extend in a first direction intersecting an extension direction of the data lines. A light emitting array layer is disposed on the circuit array layer and comprises a plurality of light emitting elements respectively corresponding to the plurality of emission areas. The circuit array layer further comprises a bias supply line extending from the sub-region to the non-display area and configured to transmit a bias power, a first power supply line and a second power supply line extending from the sub-region to the non-display area and configured to transmit a first power and a second power for driving the light emitting elements, respectively, and data supply lines respectively connecting the data lines to the display driving circuit disposed in the sub-region. The data lines comprise a first data line disposed in a middle region of the display area adjacent to the sub-region in a second direction intersecting the first direction and connected to a first data supply line among the data supply lines; a second data line disposed in a first side region of the display area in contact with the middle region in the first direction and connected to a second data supply line among the data supply lines; and a third data line disposed in a second side region of the display area between the first side region and the non-display area. The first dummy lines comprise a first data detour line adjacent to a part of the second data line and connected to a third data supply line among the data supply lines, and auxiliary lines other than the first data detour line. The second dummy lines comprise a second data detour line connecting the first data detour line to the third data line, and additional lines other than the second data detour line. Some auxiliary lines of the auxiliary lines and some additional lines of the additional lines are electrically connected to the bias supply line. Some others of the auxiliary lines and some others of the additional lines are electrically connected to the second power supply line.

The auxiliary lines comprise a second power auxiliary line to which the second power is configured to be applied; and a bias auxiliary line to which the bias power is configured to be applied.

At least one second power auxiliary line and at least one bias auxiliary line are alternately disposed in the first direction.

The additional lines comprise a second power additional line to which the second power is configured to be applied; and a bias additional line to which the bias power is configured to be applied. The second power additional line is electrically connected to the second power auxiliary line through a first dummy contact hole. The bias auxiliary line is electrically connected to the bias auxiliary line through a second dummy contact hole.

The circuit array layer further comprises first power additional lines disposed in the display area, extending in the first direction, and electrically connected to the first power supply line. The first power additional lines and the second dummy lines are alternately disposed.

The circuit array layer is provided to have a structure comprising a semiconductor layer on the substrate; a first conductive layer on a first gate insulating layer covering the semiconductor layer; a second conductive layer on a second gate insulating layer covering the first conductive layer; a third conductive layer on an interlayer insulating layer covering the second conductive layer; a fourth conductive layer on a first planarization layer covering the third conductive layer; and a fifth conductive layer on a second planarization layer covering the fourth conductive layer. The data lines and the first dummy lines are included in the fifth conductive layer. The second dummy lines and the first power additional lines are included in the fourth conductive layer.

The circuit array layer further comprises a bias line included in the second conductive layer, configured to electrically connect the bias supply line to the plurality of pixel drivers, and extending in the first direction. The bias line is electrically connected to a bias connection electrode included in the third conductive layer through a first bias connection hole extending through the interlayer insulating layer. The bias additional line, which is a part of the second dummy lines, is electrically connected to the bias connection electrode through a second bias connection hole extending through the first planarization layer. The second dummy contact hole extends through the second planarization layer.

The circuit array layer further comprises a first power line configured to electrically connect the plurality of pixel drivers to the first power supply line; a scan write line configured to transmit a scan write signal to the plurality of pixel drivers; a scan control line configured to transmit a scan control signal to the plurality of pixel drivers; a scan initialization line configured to transmit a scan initialization signal to the plurality of pixel drivers; an emission control line configured to transmit an emission control signal to the plurality of pixel drivers; a bias control line configured to transmit a bias control signal to the plurality of pixel drivers; a gate initialization voltage line configured to transmit a first initialization voltage to the plurality of pixel drivers; and an anode initialization voltage line configured to transmit a second initialization voltage to the plurality of pixel drivers. Anode electrodes of the plurality of light emitting elements are respectively connected to the plurality of pixel drivers. Cathode electrodes of the plurality of light emitting elements are electrically connected to the second power supply line. One pixel driver of the plurality of pixel drivers comprises a first transistor configured to generate a driving current for driving the light emitting element based on a data signal through one of the data lines; a second transistor disposed between the one data line and a first electrode of the first transistor, and configured to transmit the data signal through the one data line to the first electrode of the first transistor based on the scan write signal; a third electrode disposed between a gate electrode of the first transistor and a second electrode of the first transistor, and configured to connect the gate electrode of the first transistor to the second electrode of the first transistor based on the scan control signal; a fourth transistor disposed between the gate initialization voltage line and the gate electrode of the first transistor, and configured to transmit the first initialization voltage to the gate electrode of the first transistor based on the scan initialization signal; a fifth transistor disposed between the first power line and the first electrode of the first transistor and configured to transmit the first power to the first electrode of the first transistor based on the emission control signal; a sixth transistor disposed between the anode electrode of one of the light emitting elements and the second electrode of the first transistor, and configured to connect the second electrode of the first transistor to the anode electrode of the one light emitting element based on the emission control signal; a seventh transistor disposed between the anode initialization voltage line and a second electrode of the sixth transistor, and configured to transmit the second initialization voltage to the second electrode of the sixth transistor based on the bias control signal; and an eighth transistor disposed between the bias line and the first electrode of the first transistor, and configured to transmit the bias voltage to the first electrode of the first transistor based on the bias control signal. The scan write line, the scan control line, the scan initialization line, the emission control line, and the bias control line extend in the first direction and are included in the first conductive layer. A channel, a first electrode, and a second electrode of each of the first transistor, the second transistor, the third transistor, the fourth transistor, the fifth transistor, the sixth transistor, the seventh transistor, and the eighth transistor are included in the semiconductor layer. The gate electrode of the first transistor is included in the first conductive layer. The gate electrode of the second transistor and the gate electrode of the third transistor are different parts of the scan write line. The gate electrode of the fourth transistor is a part of the scan initialization line. The gate electrode of the fifth transistor and the gate electrode of the sixth transistor are different parts of the emission control line. The gate electrode of the seventh transistor and the gate electrode of the eighth transistor are different parts of the bias control line. The first power line comprises a first power sub-line included in the second conductive layer and extending in the first direction; and a first power main line included in the third conductive layer, extending in the second direction, and electrically connected to the first power sub-line and the first power additional line.

A display device according to one embodiment includes a circuit array layer including data lines configured to transmit data signals to a plurality of pixel drivers respectively corresponding to a plurality of emission areas, first dummy lines respectively adjacent to the data lines, and second dummy lines extending in a direction intersecting the first dummy lines. The circuit array layer further includes data supply lines respectively connecting the data lines to the display driving circuit disposed in a sub-region.

The data lines include a first data line disposed in the middle region of the display area adjacent to the sub-region and connected to a first data supply line, a second data line disposed in a first side region of the display area in contact with both sides of the middle region and connected to a second data supply line, and a third data line disposed in a second side region of the display area between the non-display area and the first side region.

The first dummy lines include a first data detour line adjacent to a part of the second data line and connected to a third data supply line, and auxiliary lines other than the first data detour line. Further, the second dummy lines include a second data detour line connecting the first data detour line to the third data line, and additional lines other than the second data detour line.

Some of the auxiliary lines are second power auxiliary lines to which a second power is configured to be applied, and some others of the auxiliary lines are bias auxiliary lines to which a bias power is configured to be applied.

Further, some of the additional lines are second power additional lines to which the second power is configured to be applied, and some others of the additional lines are bias additional lines to which the bias power is configured to be applied.

Meanwhile, a part of the non-display area in contact with the second side region is bent along the edges of the substrate.

However, in accordance with one embodiment, the third data line disposed in the second side region in contact with the non-display area is connected to the third data supply line through the first data detour line and the second data detour line disposed in the display area. That is, the third data supply line is not directly connected to the third data line, but is connected to the first data detour line disposed in the first side region.

Accordingly, the third data supply line connected to the third data line of the second side region does not extend to a part of the non-display area in contact with the second side region and, thus, the width of the bent portion of the non-display area may be reduced.

Hence, the width of the non-display area may be reduced without reducing the number of data lines, that is, without affecting resolution.

In addition, in accordance with one embodiment, the first data detour line is provided as a part of the first dummy lines respectively adjacent to the data lines, and the second data detour line is provided as a part of the second dummy lines extending in a direction intersecting the data lines. As described above, in the region of the display area where the first data detour line and the second data detour line are not disposed, the auxiliary lines that are some other parts of the first dummy lines and the additional lines that are some other parts of the second dummy lines are disposed. Accordingly, the visibility of the first data detour line and the second data detour line may be decreased.

Further, in accordance with one embodiment, the second power is configured to be applied to some of the auxiliary lines and some of the additional lines, and the bias power is configured to be applied to some others of the auxiliary lines and some others of the additional lines.

Accordingly, both the resistance of the second power line transmitting the second power to the display area and the resistance of the bias line transmitting the bias power to the display area may be reduced. Therefore, the RC delay of the bias line as well as the RC delay of the second power line may be reduced, so that the image quality of the display device may be improved.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings.

DETAILED DESCRIPTION OF THE EMBODIMENTS

Figure 1:
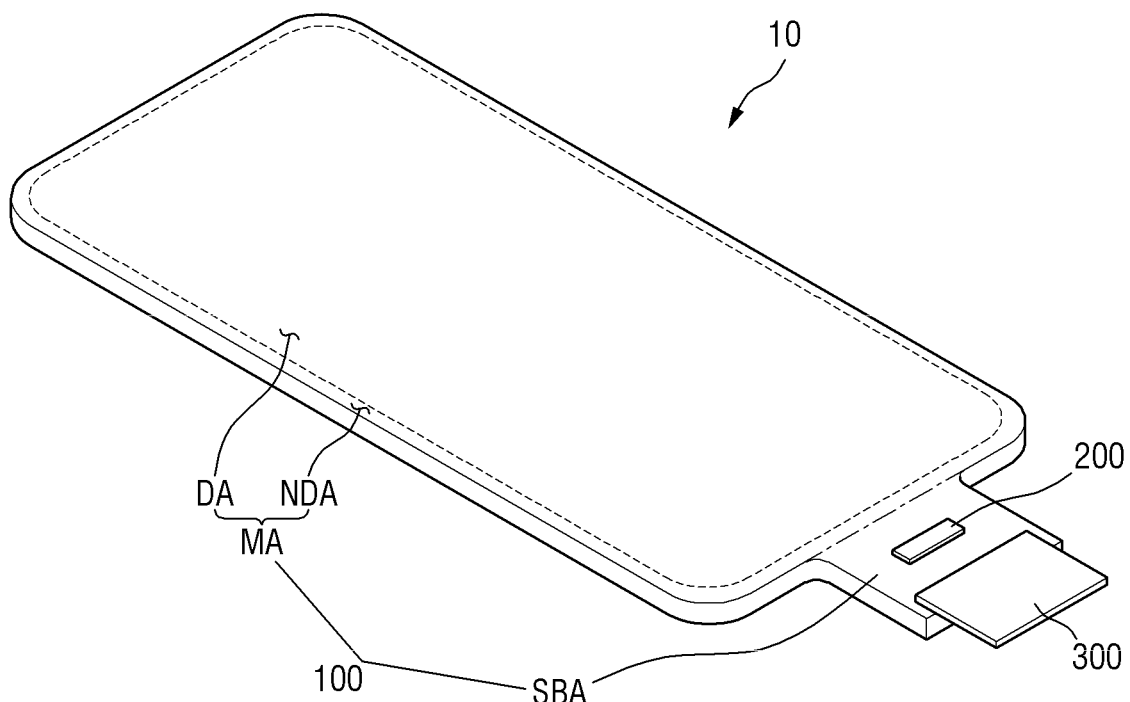
FIG. 1 is a perspective view illustrating a display device according to one embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity, for example, the limitations of the measurement system. For example, "about" may mean within one or more standard deviations, or within +30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein including technical and scientific terms have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
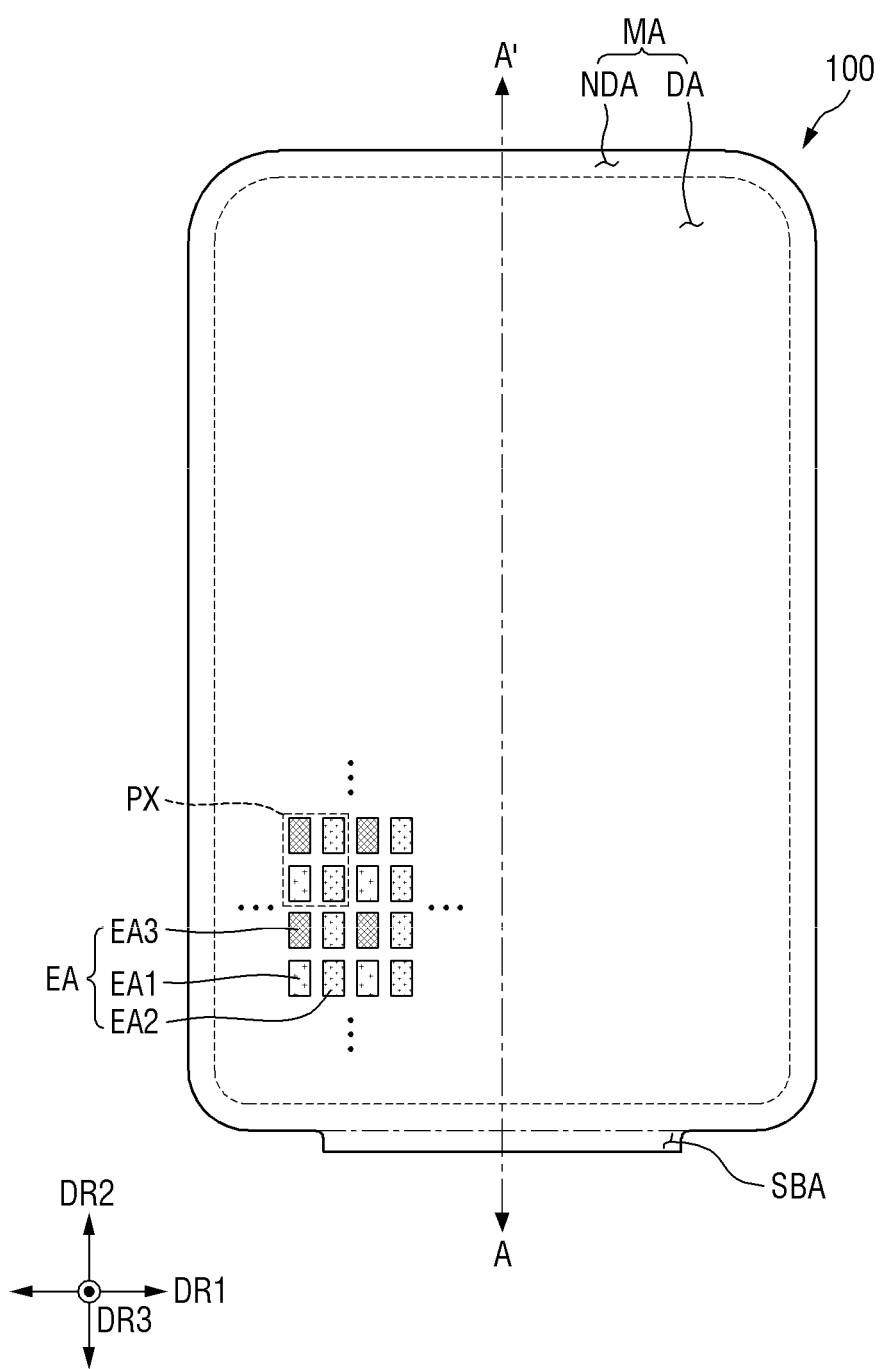
FIG. 2 is a plan view illustrating a display panel of the display device of FIG. 1.
Figure 3:
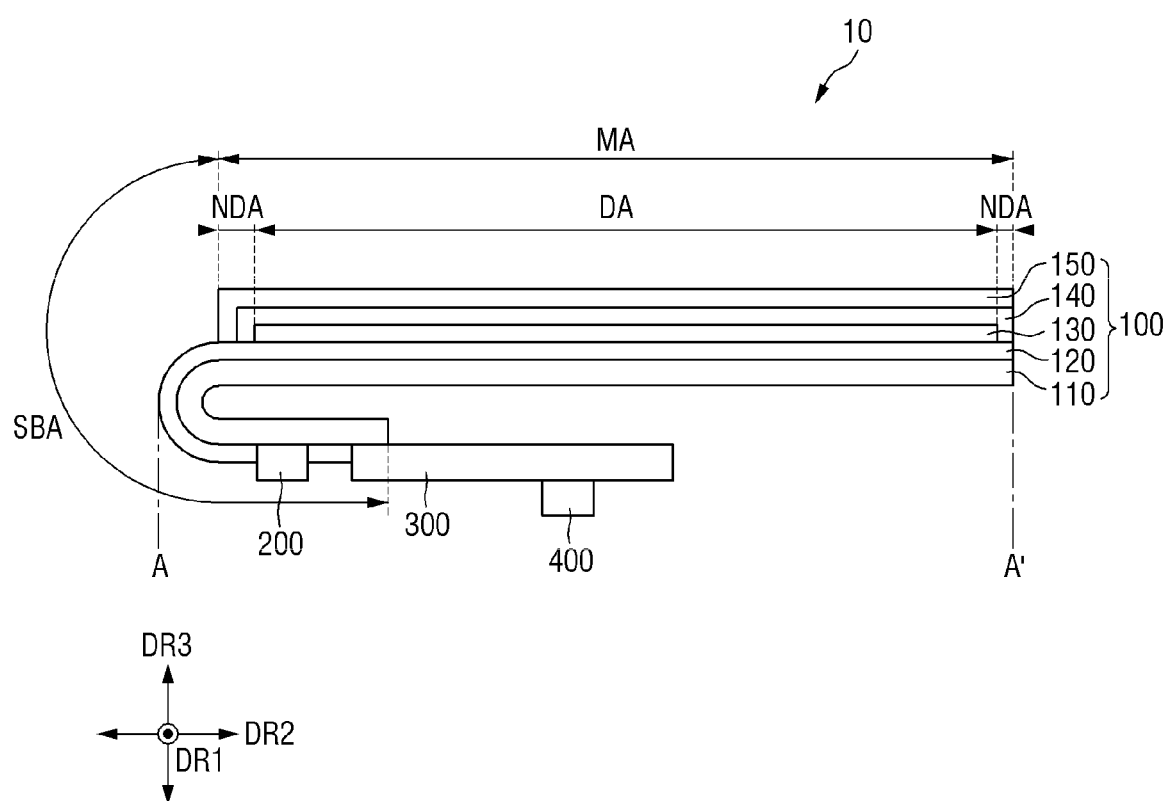
FIG. 3 is a cross-sectional view illustrating an example of a plane taken along line A-A' of FIG. 2.

FIG. 1 is a perspective view illustrating a display device 10 according to one embodiment. FIG. 2 is a plan view illustrating a display panel 100 of the display device 10 of FIG. 1. FIG. 3 is a cross-sectional view illustrating an example of a plane taken along line A-A' of FIG. 2.

Referring to FIG. 1, the display device 10 is a device for displaying a moving image or a still image. The display device 10 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 10 is an organic light emitting display device. However, the present disclosure may be applied to a display device including an organic insulating material, an organic light emitting material, and a metal material in an embodiment.

The display device 10 may be formed to be flat. However, the display device 10 may include a curved portion formed at left and right ends and having a predetermined curvature or a varying curvature in an embodiment. In addition, the display device 10 may be formed flexibly so that it can be curved, bent, folded, or rolled.

The display device 10 may include the display panel 100, a display driving circuit 200, and a circuit board 300.

Referring to FIG. 2, at least one surface of the display panel 100 includes a main region MA including a display area DA from which light for image display is emitted and a non-display area NDA disposed around the display area DA.

That is, the display panel 100 includes the main region MA and a sub-region SBA protruding from one side of the main region MA, and the main region MA includes the display area DA and the non-display area NDA. The sub-region SBA may be a region protruding from the non-display area NDA of the main region MA to one side in a second direction DR2.

FIG. 2 illustrates a case in which a part of the sub-region SBA is bent. Since a part of the sub-region SBA is deformed to be bent, another part of the sub-region SBA may be disposed on the rear surface of the display panel 100.

A plurality of emission areas EA emitting light with respective luminances are arranged in the display area DA.

The display area DA may, in plan view, be formed in a rectangular shape having short sides in a first direction DR1 and long sides in the second direction DR2 crossing the first direction DR1. The corner where the short side in the first direction DR1 and the long side in the second direction DR2 meet may be rounded to have a predetermined curvature or may be right-angled. In an embodiment, the planar shape of the display area DA is a non-rectangular shape such as another polygonal shape, a circular shape or an elliptical shape.

The display area DA may occupy most of the main region MA. The display area DA may be disposed at the center of the main region MA.

The display area DA may include the plurality of emission areas EA arranged side by side. In addition, the display area DA may further include a non-emission area which is a separation region between the plurality of emission areas EA.

The plurality of emission areas EA may be arranged side by side in the first direction DR1 and the second direction DR2.

Each of the plurality of emission areas EA may have a rhombus planar shape or a rectangular planar shape. However, this is only an example, and the planar shape of the plurality of emission areas EA may have a polygonal shape such as a rhombus shape or a hexagonal shape other than a rectangular shape, a circular shape, or an elliptical shape in a plan view.

The plurality of emission areas EA may include first emission areas EA1 emitting light of a first color in a predetermined wavelength band, second emission areas EA2 emitting light of a second color in a wavelength band lower than that of the first color, and third emission areas EA3 emitting light of a third color in a wavelength band lower than that of the second color.

For example, the first color may be red having a wavelength band of approximately 600 nm to 750 nm. The second color may be green having a wavelength band of approximately 480 nm to 560 nm. The third color may be blue having a wavelength band of approximately 370 nm to 460 nm.

As illustrated in FIG. 2, the first emission areas EA1 and the third emission areas EA3 may be alternately arranged in at least one of the first direction DR1 and the second direction DR2. Further, the second emission areas EA2 may be arranged side by side in at least one of the first direction DR1 and the second direction DR2.

A plurality of pixels PX displaying respective luminances and colors may include the plurality of emission areas EA. Each of the plurality of pixels PX may be a basic unit for displaying various colors including white with a predetermined luminance.

Each of the plurality of pixels PX may include at least one first emission area EA1, at least one second emission area EA2, and at least one third emission area EA3 that are adjacent to each other.

Each of the plurality of pixels PX may display a luminance and a color obtained by mixing lights emitted from at least one first emission area EA1, at least one second emission area EA2, and at least one third emission area EA3 that are adjacent to each other.

Meanwhile, although FIG. 2 illustrates a case in which the plurality of emission areas EA have the same area, in an embodiment, the third emission area EA3 may have the largest area and the second emission area EA2 may have the smallest area.

Further, although FIG. 2 illustrates a case in which the plurality of emission areas EA are arranged side by side in the first direction DR1 and the second direction DR2, in an embodiment, the second emission areas EA2 may be adjacent to the first emission area EA1 and the third emission area EA3 in a diagonal direction intersecting the first direction DR1 and the second direction DR2.

Referring to FIG. 3, the display panel 100 of the display device 10 includes a substrate 110 including the main region MA and the sub-region SBA, a circuit array layer 120 disposed on the substrate 110, and a light emitting array layer 130 disposed on the circuit array layer 120.

Figure 5:
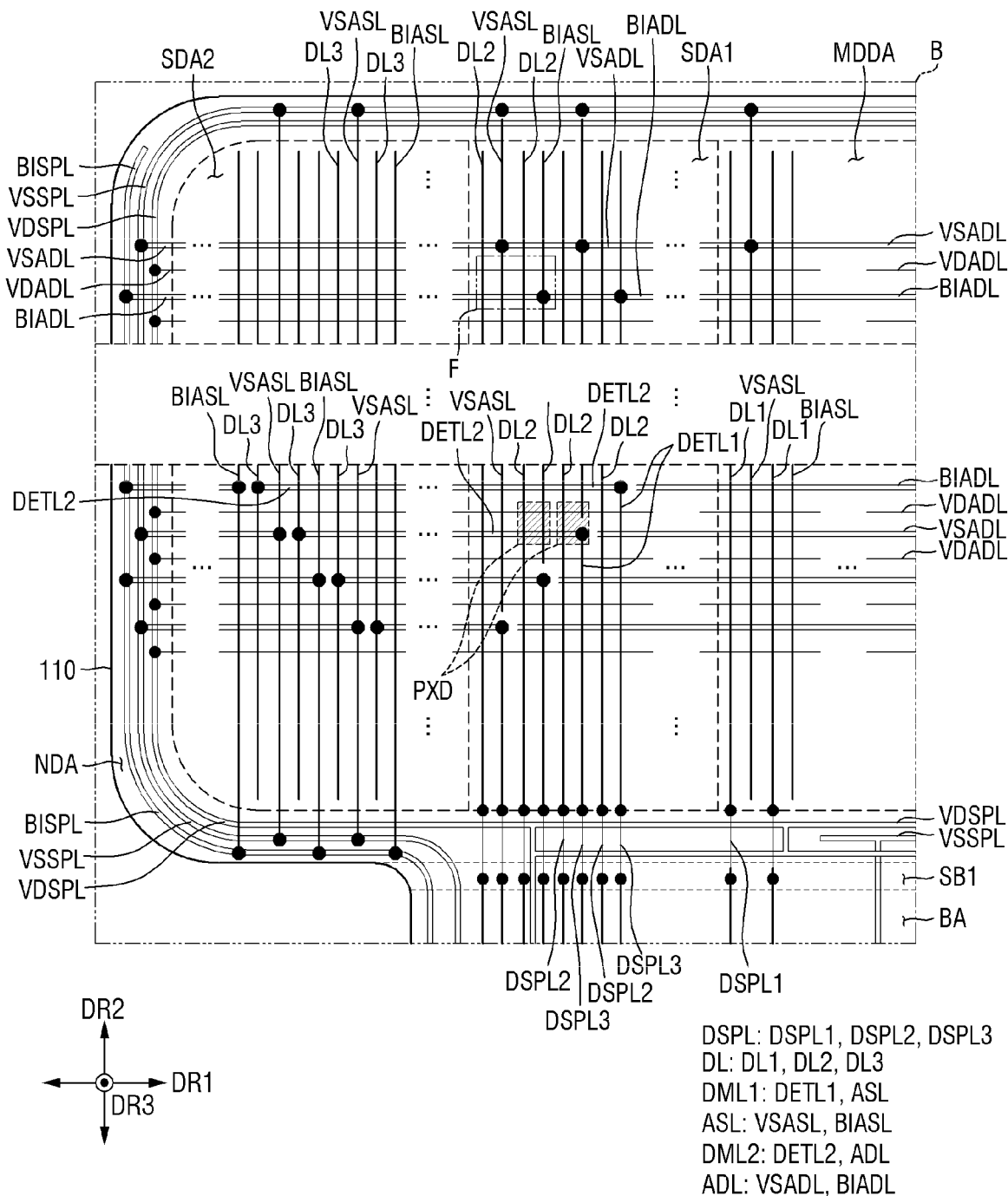
FIG. 5 is a layout diagram illustrating part B of FIG. 4.
Figure 6:
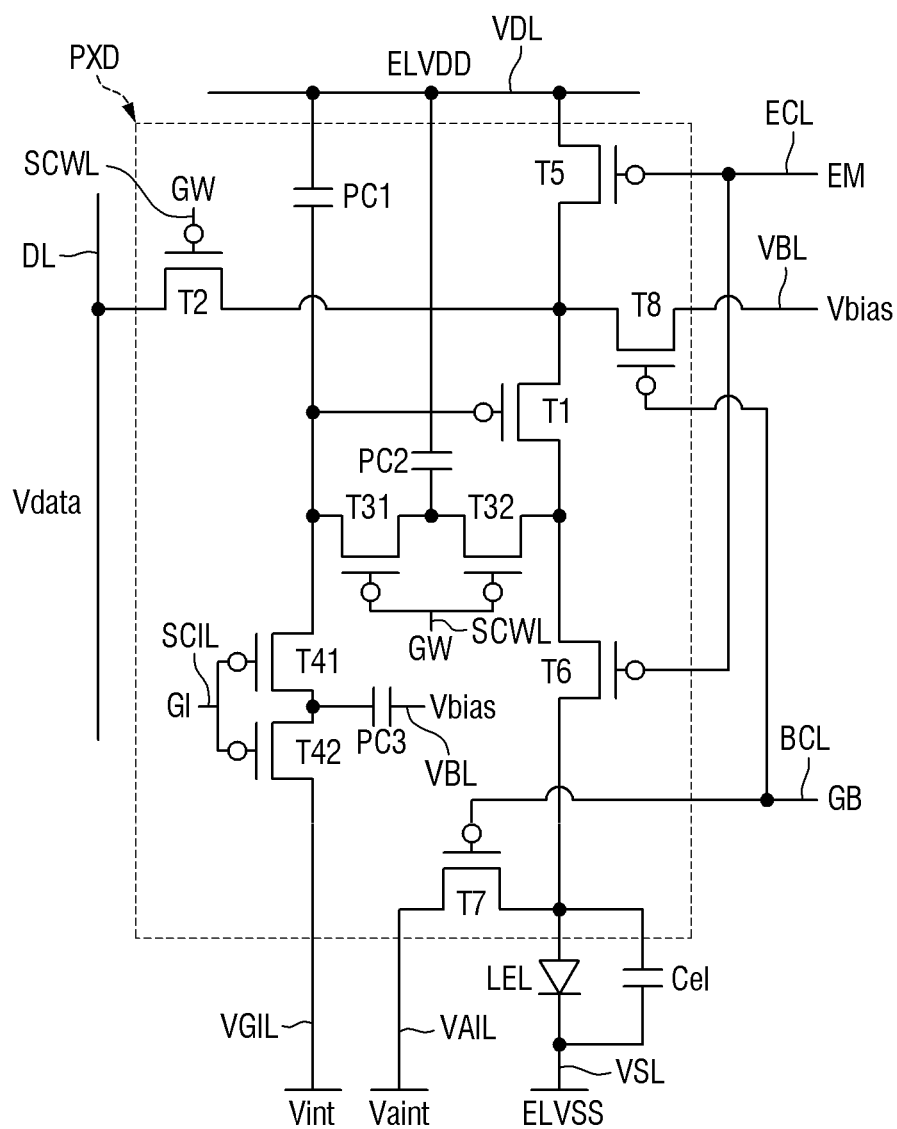
FIG. 6 is an equivalent circuit diagram illustrating an example of the pixel driver of FIG. 5.

The circuit array layer 120 includes a plurality of pixel drivers PXD, e.g., see FIGS. 5 and 6, respectively corresponding to the plurality of emission areas EA, data lines DL, e.g., see FIGS. and 6, extending in the second direction DR2 and transmitting data signals to the plurality of pixel drivers PXD, first dummy lines DML1 extending in the second direction DR2 and respectively adjacent to the data lines DL, and second dummy lines DML2 extending in the first direction DR1.

The display device 10 may further include the display driving circuit 200 disposed in the sub-region SBA of the substrate 10. The display driving circuit 200 may supply the data signals of the data lines DL.

The circuit array layer 120 further includes data supply lines DSPL, e.g., see FIG. 5, respectively connecting the display driving circuit 200 to the data lines DL.

Figure 14:
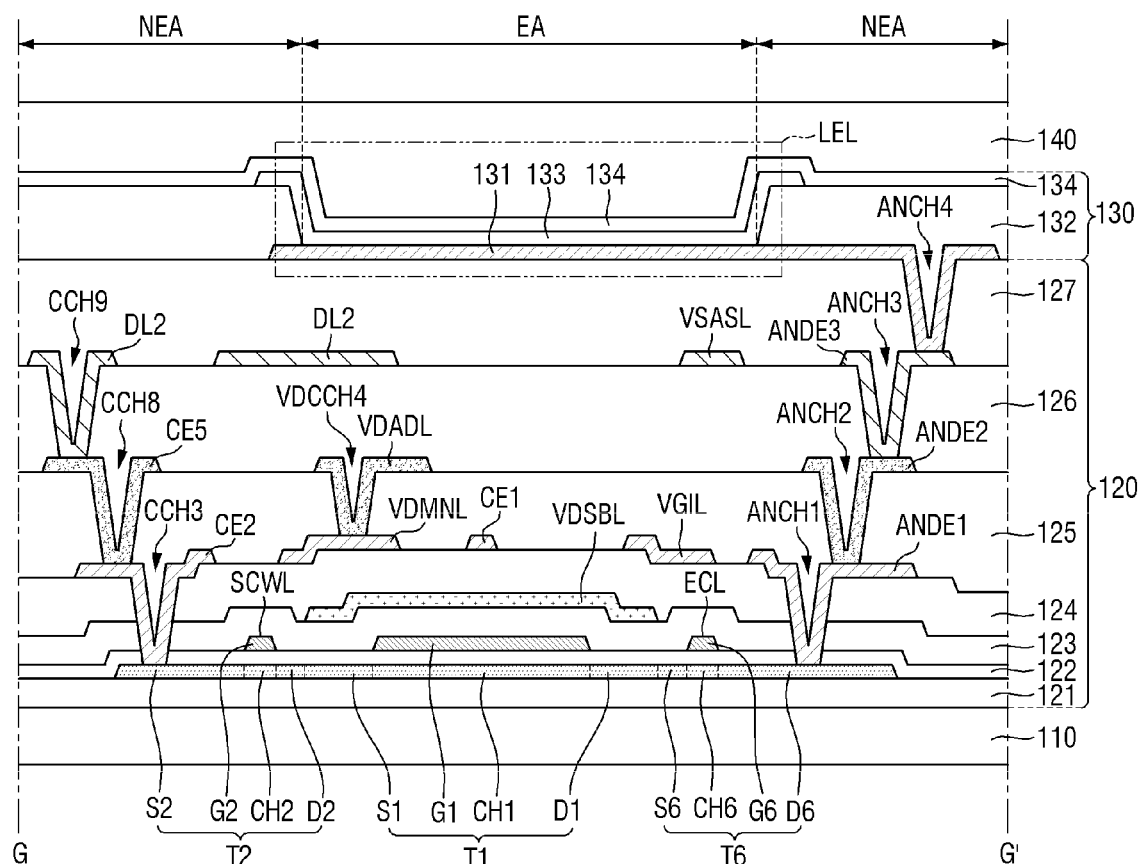
FIG. 14 is a cross-sectional view showing an example of a plane taken along line G-G' of FIG. 8.

The light emitting array layer 130 includes a plurality of light emitting elements LEL, e.g., see FIGS. 6 and 14, respectively corresponding to the plurality of emission areas EA.

In addition, the display panel 100 of the display device 10 may further include a sealing layer 140 covering the light emitting array layer 130, and a sensor electrode layer 150 disposed on the sealing layer 140.

The substrate 110 may be formed of an insulating material such as a polymer resin. For example, the substrate 110 may be formed of polyimide. The substrate 110 may be a flexible substrate which can be bent, folded or rolled.

Alternatively, the substrate 100 may be formed of an insulating material such as glass or the like.

As will be described later with reference to FIG. 14, the circuit array layer 120 may have a structure including a semiconductor layer SEL, e.g., see FIG. 9, on the substrate 110, a first conductive layer CDL1, e.g., see FIG. 9, on a first gate insulating layer 122 covering the semiconductor layer SEL, a second conductive layer CDL2, e.g., see FIG. 10, on a second gate insulating layer 123 covering the first conductive layer CDL1, a third conductive layer CDL3, e.g., see FIG. 11, on an interlayer insulating layer 124 covering the second conductive layer CDL2, a fourth conductive layer CDL4, e.g., see FIG. 12, on a first planarization layer 125 covering the third conductive layer CDL3, a fifth conductive layer CDL5, e.g., see FIG. 13, on a second planarization layer 126 covering the fourth conductive layer CDL4, and a third planarization layer 127 covering the fifth conductive layer CDL5.

The sealing layer 140 is disposed on the circuit array layer 120, corresponds to the main region MA, and covers the light emitting array layer 130. The sealing layer 140 may include a structure in which at least one inorganic layer and at least one organic layer are alternately stacked on the light emitting array layer 130.

The sensor electrode layer 150 may be disposed on the sealing layer 140 and may correspond to the main region MA. The sensor electrode layer 150 may include touch electrodes for sensing a touch of a person or an object.

The display driving circuit 200 may be provided as an integrated circuit (IC) and mounted on the second sub-region SB2 of the substrate 110 by a chip on glass (COG) method, a chip on plastic (COP) method, or an ultrasonic bonding method. However, this is only an example, and the display driving circuit 200 may be attached onto the circuit board 300 by a chip on film (COF) method in an embodiment The circuit board 300 may be attached and electrically connected to the signal pads PD of the second sub-region SB2 using a low-resistance high-reliability material such as SAP or an anisotropic conductive film.

The pixel drivers PXD of the display area DA and the display driving circuit 200 may receive digital video data, timing signals, and driving voltages from the circuit board 300.

The circuit board 300 may be a flexible printed circuit board, a printed circuit board, or a flexible film such as a chip on film.

Figure 4:
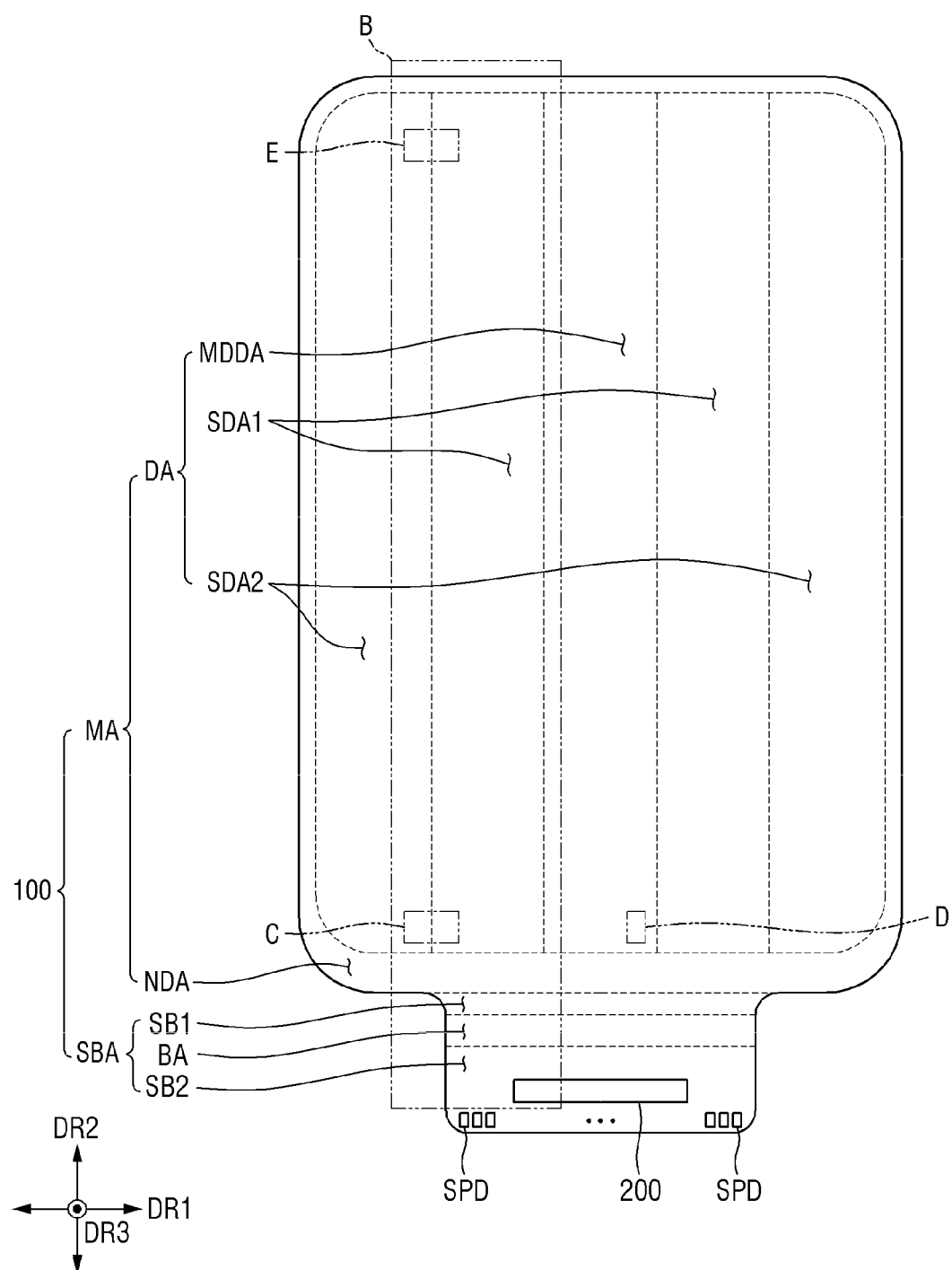
FIG. 4 is a plan view illustrating the main region and the sub-region of the display device of FIG. 1.

The circuit board 300 may be bonded to signal pads SPD, e.g., see FIG. 4, disposed in the sub-region SBA of the substrate 110.

In addition, the display device 10 may further include a cover window (not shown) disposed on the sensor electrode layer 150. The cover window may be attached to the sensor electrode layer 150 by a transparent adhesive member such as an optically clear adhesive (OCA) film or an optically clear resin (OCR). The cover window may be made of an inorganic material such as glass, or an organic material such as plastic or a polymer material. Due to the cover window, the sensor electrode layer 150, the sealing layer 140, the light emitting array layer 130, and the circuit array layer 120 may be protected from electrical and physical impact on the display surface.

In addition, the display device 10 may further include an anti-reflection member (not shown) disposed between the sensor electrode layer 150 and the cover window. The anti-reflection member may be a polarizing film or a color filter. The anti-reflection member blocks external light reflected from the sensor electrode layer 150, the sealing layer 140, the light emitting array layer 130, the circuit array layer 120, and the interfaces thereof, so that it is possible to prevent a decrease in visibility of an image in the display device 10.

The display device 10 may further include a touch driving circuit 400 for driving the sensor electrode layer 150.

The touch driving circuit 400 may be provided as an integrated circuit (IC). The touch driving circuit 400 may be electrically connected to the sensor electrode layer 150 while being mounted on the circuit board 300.

Alternatively, similarly to the display driving circuit 200, the touch driving circuit 400 may be mounted on the second sub-region SB2 of the substrate 110.

The touch driving circuit 400 may apply a touch driving signal to a plurality of driving electrodes provided on the sensor electrode layer 150, receive a touch sensing signal of each of a plurality of touch nodes through the plurality of sensing electrodes, and sense a charge change amount of mutual capacitance based on the touch sensing signal.

That is, the touch driving circuit 400 may determine whether the user's touch occurs, whether the user is proximate, and the like, according to the touch sensing signals of each of the plurality of touch nodes. The user's touch indicates direct contact of an object such as a user's finger or a pen with the front surface of the display device 10. The proximity of the user indicates that an object such as a user's finger or a pen is positioned away from the front surface of the display device 10, such as hovering.

FIG. 4 is a plan view illustrating the main region and the sub-region of the display device of FIG. 1.

Referring to FIG. 4, the display panel 100 of the display device 10 according to one embodiment includes the main region MA including the display area DA and the non-display area NDA, and the sub-region SBA protruding from one side of the main region MA.

The display area DA includes the plurality of emission areas EA arranged in the first direction DR1 and the second direction DR2. In addition, the display area DA may further include a non-emission area NEA, e.g., see FIG. 14, which is a separation region between the plurality of emission areas EA.

The display area DA may include a middle region MDDA adjacent to the sub-region SBA in the second direction DR2 and disposed at the center of the first direction DR1, a first side region SDA1 in contact with both sides of the middle region MDDA in the first direction DR1, and a second side region SDA2 between the first side region SDA1 and the non-display area NDA.

That is, the first side region SDA1 and the second side region SDA2 may be disposed between each of both sides of the middle region MDDA in the first direction DR1 and the non-display area NDA.

A part of the non-display area NDA in contact with the second side region SDA2 may be bent along the edges of the substrate 110.

Although not shown in detail, the circuit array layer 120 may further include a scan driving circuit (not shown) disposed in the non-display area NDA adjacent to at least one side of the display area DA in the first direction DR1. The scan driving circuit may supply respective scan signals to the scan lines disposed in the display area DA and extending in the first direction DR1.

For example, the display driving circuit 200 or the circuit board 300 may supply a scan control signal to the scan driving circuit based on digital video data and timing signals.

The sub-region SBA may include a bending area BA that is deformed to be bent, and a first sub-region SB1 and a second sub-region SB2 that are in contact with both sides of the bending area BA.

The first sub-region SB1 is disposed between the main region MA and the bending area BA. One side of the first sub-region SB1 may be in contact with the non-display area NDA of the main region MA, and the other side of the first sub-region SB1 may be in contact with the bending area BA.

The second sub-region SB2 is spaced apart from the main region MA with the first sub-region SB1 and the bending area BA interposed therebetween, and faces the bottom surface of the substrate 110 by the bending area BA deformed to be bent. That is, the second sub-region SB2 may overlap the main region MA in a thickness direction DR3 of the substrate 110 due to the bending region BA deformed to be bent.

One side of the second sub-region SB2 may be in contact with the bending area BA. The other side of the second sub-region SB2 may be in contact with a part of the edge of the substrate 110.

The display driving circuit 200 may be disposed in the second sub-region SB2.

Further, the signal pads SPD bonded to the circuit board 300 may also be disposed in the second sub-region SB2.

FIG. 5 is a layout diagram illustrating area B of FIG. 4.

As described above, in the display device 10 according to one embodiment includes the substrate 110 including the main region MA including the display area DA in which the plurality of emission areas EA are arranged in the first direction DR1 and the second direction DR2 and the non-display area NDA disposed around the display the DA, and the sub-region SBA protruding from one side of the main region MA, the circuit array layer 120 disposed on the substrate 110, and the light emitting array layer 130 disposed on the circuit array layer 120. The light emitting array layer 130 includes a plurality of light emitting elements LEL respectively corresponding to the plurality of emission areas EA.

Referring to FIG. 5, the circuit array layer 120 according to one embodiment includes the plurality of pixel drivers PXD respectively corresponding to the plurality of emission areas EA, the data lines DL extending in the second direction DR2 and transmitting data signals to the plurality of pixel drivers PXD, the first dummy lines DML1 extending in the second direction DR2 and respectively adjacent to the data lines DL, and the second dummy lines DML2 extending in the first direction DR1.

In addition, the circuit array layer 120 further includes a bias supply line BISPL extending from the sub-region SBA to the non-display area NDA and transmitting a predetermined bias power Vbias, e.g., see FIG. 6, a first power supply line VDSPL and a second power supply line VSSPL extending from the sub-region SBA to the non-display area NDA and respectively transmitting a predetermined first power ELVDD, e.g., see FIG. 6, and a predetermined second power ELVSS, e.g., see FIG. 6, for driving the light emitting elements LEL, and the data supply lines DSPL respectively connecting the data lines DL to the display driving circuit 200 disposed in the sub-region SBA.

The data lines DL include a first data line DL1 disposed in the middle region MDDA of the display area DA and connected to a first data supply line DSPL1 among the data supply lines DSPL, a second data line DL2 disposed in the first side region SDA1 of the display area DA and connected to a second data supply line DSPL2 among the data supply lines DSPL, and a third data line DL3 disposed in the second side region SDA2 of the display area DA.

The first data supply line DSPL1 connected to the first data line DL1 of the middle region MDDA may be disposed in a part of the non-display area NDA between the middle region MDDA and the sub-region SBA.

Further, the second data supply line DSPL2 connected to the second data line DL2 of the first side region SDA1 and a third data supply line DSPL3 connected to a first data detour line DETL1 of the first side region SDA1 may be disposed in a part of the non-display area NDA between the first side region SDA1 and the sub-region SBA.

In the first side region SDA1, the second data line DL2 and the first data detour line DETL1 are alternately disposed in the first direction DR1, so that the second data supply line DSPL2 and the third data supply lines DSPL3 may be alternately disposed in the first direction DR1.

The first dummy lines DML1 extending in the second direction DR2 include the first data detour line DETL1 disposed in the first side region SDA1, and auxiliary lines ASL other than the first data detour line DETL1.

The first data detour line DETL1 is connected to the third data supply line DSPL3 among the data supply lines DSPL, and is disposed adjacent to the second data line DL2 in the first side region SDA1.

The second dummy lines DML2 extending in the first direction DR1 include a second data detour line DETL2 disposed in the first side region SDA1 and the second side region SDA2, and additional lines ADL other than the second data detour line DETL2.

The second data detour line DETL2 electrically connects the first data detour line DETL1 to the third data line DL3.

In other words, the data supply lines DSPL may include the first data supply line DSPL1 extending to the middle region MDDA, and the second data supply line DSPL2 and the third data supply line DSPL3 extending to the first side region SDA1.

The data lines DL may include the first data line DL1 disposed in the middle region MDDA, the second data line DL2 disposed in the first side region SDA1, and the third data line DL3 disposed in the second side region SDA2.

The first data line DL1 may be electrically connected to the first data supply line DSPL1.

The second data line DL2 may be electrically connected to the second data supply line DSPL2.

The first data detour line DETL1 may be electrically connected to the third data supply line DSPL3. That is, the third data line DL3 may be electrically connected to the third data supply line DSPL3 through the first data detour line DETL1 and the second data detour line DETL2.

The auxiliary lines ASL include a second power auxiliary line VSASL electrically connected to the second power supply line VSSPL, and a bias auxiliary line BIASL electrically connected to the bias supply line BISPL.

Here, at least one second power auxiliary line VSASL and at least one bias auxiliary line BIASL may be alternately disposed in the first direction DR1.

FIGS. 5, 15, 16, and 17 illustrate a case in which one second power auxiliary line VSASL and one bias auxiliary line BIASL are alternately disposed in the first direction DR1. However, in an embodiment, a plurality of second power auxiliary lines VSASL and a plurality of bias auxiliary lines BIASL may be alternately disposed.

The auxiliary lines ASL that are some of the first dummy lines DML1 may include one auxiliary line ASL spaced apart side by side on one side of one first data detour line DETL1 in the second direction DR2.

That is, in the first side region SDA1, the first data detour line DETL1 may be adjacent to a part of the second data line DL2, and one auxiliary line ASL spaced apart side by side on one side of the first data detour line DETL1 in the second direction DR2 may be adjacent to another part of the second data line DL2.

The circuit array layer 120 may further include first power additional lines VDADL disposed in the display area DA, extending in the first direction DR1, and electrically connected to the first power supply line VDSPL.

The first power additional lines VDADL and the second dummy lines DML2 may be alternately disposed in the second direction DR2.

The additional lines ADL that are some of the second dummy lines DML2 may include two additional lines ADL spaced apart side by side on both sides of one second data detour line DETL2 in the first direction DR1.

That is, the second data detour line DETL2 may be adjacent to a part of one first power additional line VDADL, and two additional lines ADL spaced apart side by side on both sides of the second data detour line DETL2 in the first direction DR1 may be adjacent to another part of one first power additional line VDADL.

The additional lines ADL may include a second power supply line VSADL electrically connected to the second power supply line VSSPL or the second power auxiliary line VSASL, and a bias additional line BIADL electrically connected to the bias supply line BISPL or the bias auxiliary line BIASL.

As described above, in accordance with one embodiment, the third data line DL3 disposed in the second side region SDA2 is connected to the third data supply line DSPL3 through the first data detour line DETL1 in the first side region SDA1 and the second data detour line DETL2 of the first direction DR1.

That is, the third data supply line DSPL3 is not directly connected to the third data line DL3 disposed in the second side region SDA2, but is connected to the first data detour line DETL1 of the first side region SDA1.

Therefore, a part of the non-display area NDA that is bent and adjacent to the second side region SDA2 may have a reduced width because the third data supply line DSPL3 is not disposed.

Further, since the first data detour line DETL1 is provided as a part of the first dummy lines DML1 and the second data detour line DETL2 is provided as a part of the second dummy lines DML2, the visibility of the first data detour line DETL1 and the second data detour line DETL2 may be decreased.

In addition, in accordance with one embodiment, among the first dummy lines DML1, the auxiliary lines ASL other than the first data detour line DETL1 include the second power auxiliary line VSASL to which the second power ELVSS is applied, and the bias auxiliary line BIASL to which the bias power Vbias is applied.

Further, among the second dummy lines DML2, the additional lines ADL other than the second data detour line DETL2 include the second power additional line VSADL to which the second power ELVSS is applied, and the bias additional line BIADL to which the bias power Vbias is applied.

That is, the additional lines ADL and the auxiliary lines ASL for decreasing the visibility of the first data detour line DETL1 and the second data detour line DETL2 are not in a floating state, and some lines VSASL of the auxiliary lines ASL and some lines VSADL of the additional lines ADL are electrically connected to the second power supply line VSSPL, and some other lines BIASL and BIADL thereof are electrically connected to the bias supply line BISPL.

Accordingly, both the RC delay of a second power line VSL transmitting the second power ELVSS to the display area DA and the RC delay of a bias line VBL transmitting the bias power Vbias to the display device DA may be reduced by the auxiliary lines ASL and the additional lines ADL, thereby improving the display quality of the display device 10.

The pixel driver PXD according to one embodiment is electrically connected to the anode electrode of the light emitting element LEL, and supplies a driving current to the light emitting element LEL.

Figure 7:
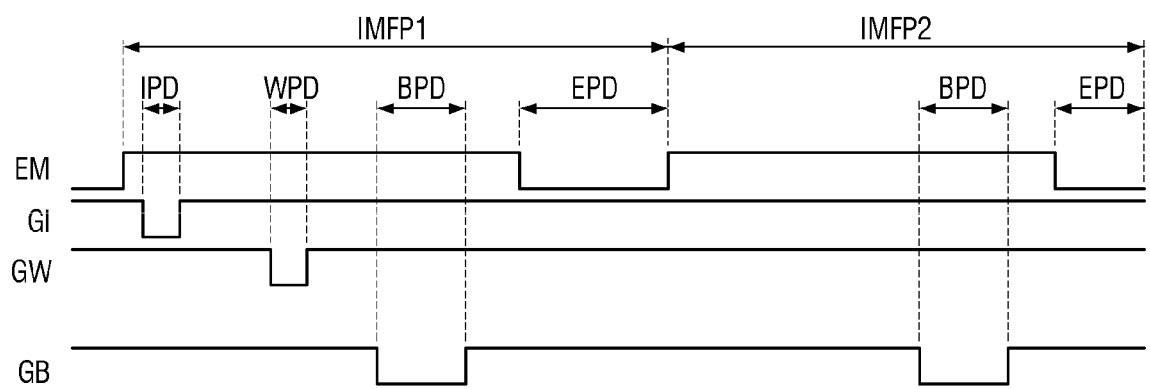
FIG. 7 is a diagram illustrating an example of the driving timing of a scan write signal, a scan initialization signal, an emission control signal, and a bias control signal of FIG. 6.

FIG. 6 is an equivalent circuit diagram illustrating an example of the pixel driver PXD of FIG. 5. FIG. 7 is a diagram illustrating an example of the driving timing of a scan write signal GW, a scan initialization signal GI, an emission control signal EM, and a bias control signal GB of FIG. 6.

Referring to FIG. 6, the pixel driver PXD according to one embodiment may include two or more transistors T1, T2, T3, T4, T5, T6, T7, and T8 including the first transistor T1 generating a driving current based on a data signal, and one or more capacitors PC1, PC2, and PC3.

As described above, the circuit array layer 120 includes the data lines DL transmitting respective data signals Vdata to the plurality of pixel drivers PXD, a first power line VDL transmitting the first power ELVDD to the plurality of pixel drivers PXD, and the bias line VBL transmitting the bias power Vbias to the plurality of pixel drivers PXD.

In addition, the circuit array layer 120 may further include a scan write line SCWL transmitting the scan write signal GW to the plurality of pixel drivers PXD, a scan initialization line SCIL transmitting the scan initialization signal GI to the plurality of pixel drivers PXD, an emission control line ECL transmitting the emission control signal EM to the plurality of pixel drivers PXD, a bias control line BCL transmitting the bias control signal GB to the plurality of pixel drivers PXD, a gate initialization voltage line VGIL transmitting a first initialization voltage Vint to the plurality of pixel drivers PXD, and an anode initialization voltage line VAIL transmitting a second initialization voltage Vaint to the plurality of pixel drivers PXD.

The pixel driver PXD according to one embodiment may include the first transistor T1, the second transistor T2, the third transistor T3, the fourth transistor T4, the fifth transistor T5, the sixth transistor T6, the seventh transistor T7, the eighth transistor T8, the first capacitor PC1, the second capacitor PC2, and the third capacitor PC3.

The first transistor T1 is connected in series with the light emitting element LEL between the first power line VDL and the second power line VSL. That is, the first electrode, e.g., the source electrode, of the first transistor T1 may be connected to the first power line VDL through the fifth transistor T5, and the second electrode, e.g., the drain electrode, of the first transistor T1 may be connected to the anode electrode of the light emitting element LEL through the sixth transistor T6.

Further, the first electrode of the first transistor T1 may be connected to the data line DL through the second transistor T2.

The gate electrode of the first transistor T1 may be connected to the first power line VDL through the first capacitor PC1. That is, the first capacitor PC1 may be connected between the gate electrode of the first transistor T1 and the first power line VDL.

Accordingly, the potential of the gate electrode of the first transistor T1 may be maintained by the first power ELVDD of the first power line VDL.

Accordingly, when the data signal Vdata of the data line DL is transmitted to the first electrode of the first transistor T1 through the turned-on second transistor T2, the voltage difference corresponding to the data signal Vdata and the first power ELVDD may be generated between the gate electrode of the first transistor T1 and the first electrode of the first transistor T1.

At this time, when the voltage difference between the gate electrode of the first transistor T1 and the first electrode of the first transistor T1, that is, the gate-source voltage difference is greater than or equal to a threshold voltage, the first transistor T1 may be turned on.

Then, when the fifth transistor T5 and the sixth transistor T6 are turned on, the first transistor T1 may generate a drain-source current corresponding to the data signal. The drain-source current of the first transistor T1 may be supplied as the driving current of the light emitting element LEL.

The light emitting element LEL may emit light having a luminance corresponding to the driving current.

The light emitting element LEL may have a structure including an anode electrode 131, e.g., see FIG. 14, and a cathode electrode 134, e.g., see FIG. 14, facing each other, and a light emitting layer 133, e.g., see FIG. 14, between the anode electrode 131 and the cathode electrode 134.

The light emitting element LEL may be an organic light emitting diode having a light emitting layer made of an organic light emitting material. In an embodiment, the light emitting element LEL may be an inorganic light emitting element including a light emitting layer made of an inorganic semiconductor. In an embodiment, the light emitting element LEL may be a quantum dot light emitting element having a quantum dot light emitting layer. In an embodiment, the light emitting element LEL may be a micro light emitting diode.

A capacitor Cel connected in parallel with the light emitting element LEL refers to a parasitic capacitance between the anode electrode and the cathode electrode.

The second transistor T2 may be connected between the first electrode of the first transistor T1 and the data line DL.

The third transistor T3 may be connected between the gate electrode of the first transistor T1 and the second electrode of the first transistor T1.

The third transistor T3 may include a plurality of sub-transistors connected in series. For example, the third transistor T3 may include a first sub-transistor T31 and a second sub-transistor T32.

The first electrode of the first sub-transistor T31 may be connected to the gate electrode of the first transistor T1, the second electrode of the first sub-transistor T31 may be connected to the first electrode of the second sub-transistor T32, and the second electrode of the second sub-transistor T32 may be connected to the second electrode of the first transistor T1.

In this way, it is possible to prevent the potential of the gate electrode of the first transistor T1 from changing due to the leakage current caused by the third transistor T3 that is not turned on.

The gate electrode of each of the second transistor T2, the first sub-transistor T31, and the second sub-transistor T32 may be connected to the scan write line SCWL.

Accordingly, when the scan write signal GW is transmitted through the scan write line SCWL, the second transistor T2, the first sub-transistor T31, and the second sub-transistor T32 may be turned on.

At this time, the data signal Vdata may be transmitted to the first electrode of the first transistor T1 through the turned-on second transistor T2.

Further, the gate electrode of the first transistor T1 and the second electrode of the first transistor T1 may have the same potential through the turned-on first sub-transistor T31 and the turned-on second sub-transistor T32.

Accordingly, the first transistor T1 may be turned on.

The second capacitor PC2 may be connected between the contact point between the first sub-transistor T31 and the second sub-transistor T32 and the first power line VDL.

In this way, the potential of the contact point between the first sub-transistor T31 and the second sub-transistor T32 is maintained by the first power ELVDD, so that the turn-off state of the first sub-transistor T31 and the second sub-transistor T32 may be maintained while the scan write signal GW of the scan write line SCWL is not transferred, which makes it possible to more easily prevent the leakage current.

The fourth transistor T4 may be connected between the gate electrode of the first transistor T1 and the gate initialization voltage line VGIL.

The fourth transistor T4 may include a plurality of sub-transistors connected in series. For example, the fourth transistor T4 may include a third sub-transistor T41 and a fourth sub-transistor T42.

The first electrode of the third sub-transistor T41 may be connected to the gate electrode of the first transistor T1, the second electrode of the third sub-transistor T41 may be connected to the first electrode of the fourth sub-transistor T42, and the second electrode of the fourth sub-transistor T42 may be connected to the gate initialization voltage line VGIL.

In this way, it is possible to prevent the potential of the gate electrode of the first transistor T1 from changing due to the leakage current caused by the fourth transistor T4 that is not turned on.

The gate electrode of each of the third sub-transistor T41 and the fourth sub-transistor T42 may be connected to the scan initialization line SCIL.

Accordingly, when the scan initialization signal GI is transmitted through the scan initialization line SCIL, the third sub-transistor T41 and the fourth sub-transistor T42 are turned on and, thus, the potential of the gate electrode of the first transistor T1 may be initialized to the first initialization voltage Vint of the gate initialization voltage line VGIL.

The third capacitor PC3 may be connected between the contact point between the third sub-transistor T41 and the fourth sub-transistor T42 and the bias line VBL.

In this way, the potential of the contact point between the third sub-transistor T41 and the fourth sub-transistor T42 is maintained by the bias power Vbias of the bias line VBL, so that the turn-off state of the third sub-transistor T41 and the fourth sub-transistor T42 may be maintained while the scan initialization signal GI of the scan initialization line SCIL is not transferred, which makes it possible to more easily prevent the leakage current.

The fifth transistor T5 may be connected between the first electrode of the first transistor T1 and the first power line VDL.

The sixth transistor T6 may be connected between the second electrode of the first transistor T1 and the anode electrode of the light emitting element LEL.

The gate electrode of each of the fifth transistor T5 and the sixth transistor T6 may be connected to the emission control line ECL.

Accordingly, when the emission control signal EM is transmitted through the emission control line ECL, the fifth transistor T5 and the sixth transistor T6 are turned on and, thus, the drain-source current of the first transistor T1 may be supplied as the driving current of the light emitting element LEL.

The seventh transistor T7 may be connected between the anode electrode of the light emitting element LEL and the anode initialization voltage line VAIL.

The eighth transistor T8 may be connected between the first electrode of the first transistor T1 and the bias line VBL.

The gate electrode of each of the seventh transistor T7 and the eighth transistor T8 may be connected to the bias control line BCL.

Accordingly, when the bias control signal GB is transmitted through the bias control line BCL, the seventh transistor T7 and the eighth transistor T8 may be turned on.

At this time, the potential of the anode electrode of the light emitting element LEL may be initialized to the second initialization voltage Vaint of the anode initialization voltage line VAIL through the turned-on seventh transistor T7.

Accordingly, it is possible to prevent the light emitting element LEL from being driven by the current remaining in the anode electrode.

Further, the potential of the first electrode of the first transistor T1 may be maintained by the bias power Vbias through the turned-on eighth transistor T8.

Accordingly, after the first transistor T1 is turned on, the potential of the first electrode of the first transistor T1 becomes similar to the potential of the gate electrode thereof or the potential of the second electrode thereof, which makes it possible to prevent the characteristics of the first transistor T1 from changing.

In particular, as shown in FIG. 7, in the case of a low-speed driving mode, at least one second image frame period IMFP2 of a self-scan mode that does not include a data write period WPD may follow a first image frame period IMFP1 of an addressing mode that includes the data write period WPD.

Each of the first image frame period IMFP1 of the addressing mode and the second image frame period IMFP2 of the self-scan mode includes an emission period EPD in which the emission control signal EM of a turn-on level, e.g., low level, is transmitted, and a bias period BPD that precedes an emission period EPD and in which the bias control signal GB of a turn-on level is transmitted.

During the bias period BPD, the seventh transistor T7 and the eighth transistor T8 are turned on by the bias control signal GB of the turn-on level. Accordingly, the potential of the anode electrode of the light emitting element LEL may be initialized to the second initialization voltage Vaint through the turned-on seventh transistor T7. Further, the potential of the first electrode of the first transistor T1 may be maintained by the bias power Vbias through the turned-on eighth transistor T8.

Then, during the emission period EPD, the fifth transistor T5 and the sixth transistor T6 are turned on by the emission control signal EM of a turn-on level. Accordingly, the first transistor T1 and the light emitting element LEL are connected in series between the first power ELVDD and the second power ELVSS through the turned-on fifth transistor T5 and the turned-on sixth transistor T6. Thus, the driving current generated by the first transistor T1 may be supplied to the light emitting element LEL, and the light emitting element LEL may emit light.

Unlike the second image frame period IMFP2 of the self-scan mode, the first image frame period IMFP1 of the addressing mode further includes the data write period WPD that precedes the bias period BPD and in which the scan write signal GW of a turn-on level is transmitted, and an initialization period IPD that precedes the data write period WPD and in which the scan initialization signal GI of a turn-on level is transmitted.

During the initialization period IPD, the fourth transistor T4 is turned on by the scan initialization signal GI of the turn-on level. Accordingly, the potential of the gate electrode of the first transistor T1 may be initialized to the first initialization voltage Vint through the turned-on fourth transistor T4.

Then, the second transistor T2 and the third transistor T3 are turned on by the scan write signal GW of the turn-on level during the data write period WPD. Accordingly, the data signal Vdata of the data line DL is transmitted to the first electrode of the first transistor T1 through the turned-on second transistor T2. Further, the gate electrode and the second electrode of the first transistor T1 have the same potential through the turned-on third transistor T3. Accordingly, the first transistor T1 is turned on and, thus, a source-drain current may be generated.

As described above, in the case of the low-speed driving mode, one or more second image frame periods IMFP2 of the self-scan mode that do not include the data write period WPD precede the first image frame period IMFP1 of the addressing mode.

In accordance with one embodiment, the second image frame period IMFP2 of the self-scan mode includes the bias period BPD that precedes the emission period EPD, so that the potential of the first electrode of the first transistor T1 may be maintained by the bias power Vbias during the emission period EPD. That is, the change in the potential of the first electrode of the first transistor T1 during the emission period EPD of the first image frame period IMFP1 may not affect the turn-on operation of the first transistor T1 during the second image frame period IMFP2 of the self-scan mode. Accordingly, the deterioration of the display quality of the display device due to the low-speed mode driving may be prevented.

Figure 8:
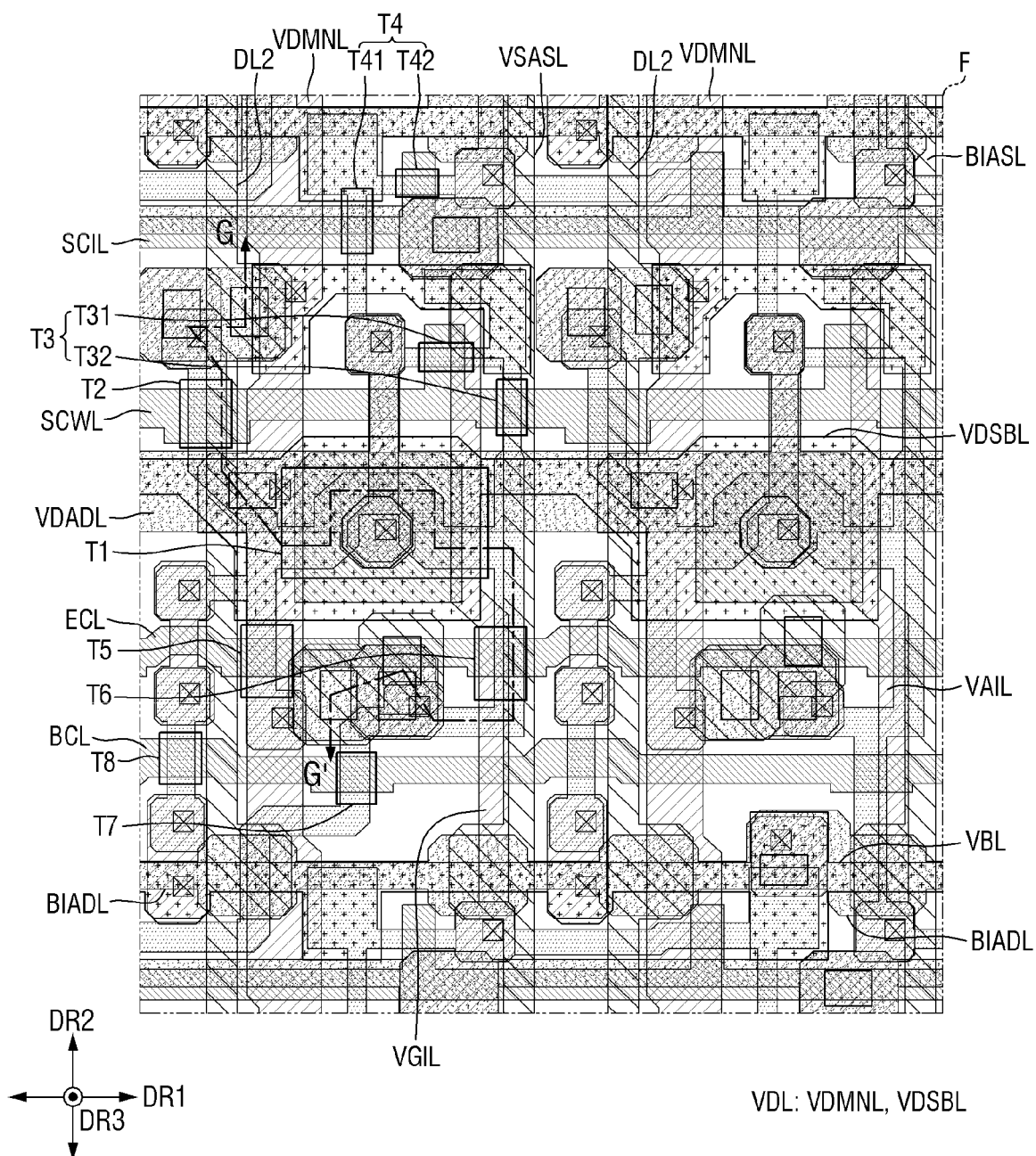
FIG. 8 is a plan view illustrating an example of part F of FIG. 5.

FIG. 8 is a plan view illustrating an example of part F of FIG. 5. FIG. 9 is a plan view illustrating a semiconductor layer SEL and a first conductive layer CDL1 of FIG. 8. FIG. 10 is a plan view illustrating a second conductive layer CDL2 of FIG. 8. FIG. 11 is a plan view illustrating a third conductive layer CDL3 of FIG. 8. FIG. 12 is a plan view illustrating a fourth conductive layer CDL4 of FIG. 8. FIG. 13 is a plan view illustrating a fifth conductive layer CDL5 of FIG. 8. FIG. 14 is a cross-sectional view showing an example of a plane taken along line G-G' of FIG. 8.

Referring to FIG. 8, the pixel driver PXD according to one embodiment may include the first to eighth transistors T1 to T8.

The scan write line SCWL, the scan initialization line SCIL, the emission control line ECL, and the bias control line BCL may extend in the first direction DR1.

The bias line VBL may extend in the first direction DR1.

The second data line DL2 disposed in the first side region SDA1 may extend in the second direction DR2.

The first power line VDL may include a first power sub-line VDSBL extending in the first direction DR1 and a first power main line VDMNL extending in the second direction DR2.

Further, the first power line VDL may be electrically connected to the first power additional line VDADL extending in the first direction DR1.

The first dummy lines DML1 extending in the second direction DR2 may include at least one second power auxiliary line VSASL and at least one bias auxiliary line BIASL that are alternately disposed in the first direction DR1.

The second dummy lines DML2 extending in the first direction DR1 may be alternately disposed with the first power additional line VDADL in the second direction DR2, and may include the bias additional line BIADL and the second power additional line VSADL.

The gate initialization voltage line VGIL may extend in the second direction DR2.

The anode initialization voltage line VAIL may extend in the second direction DR2.

Figure 9:
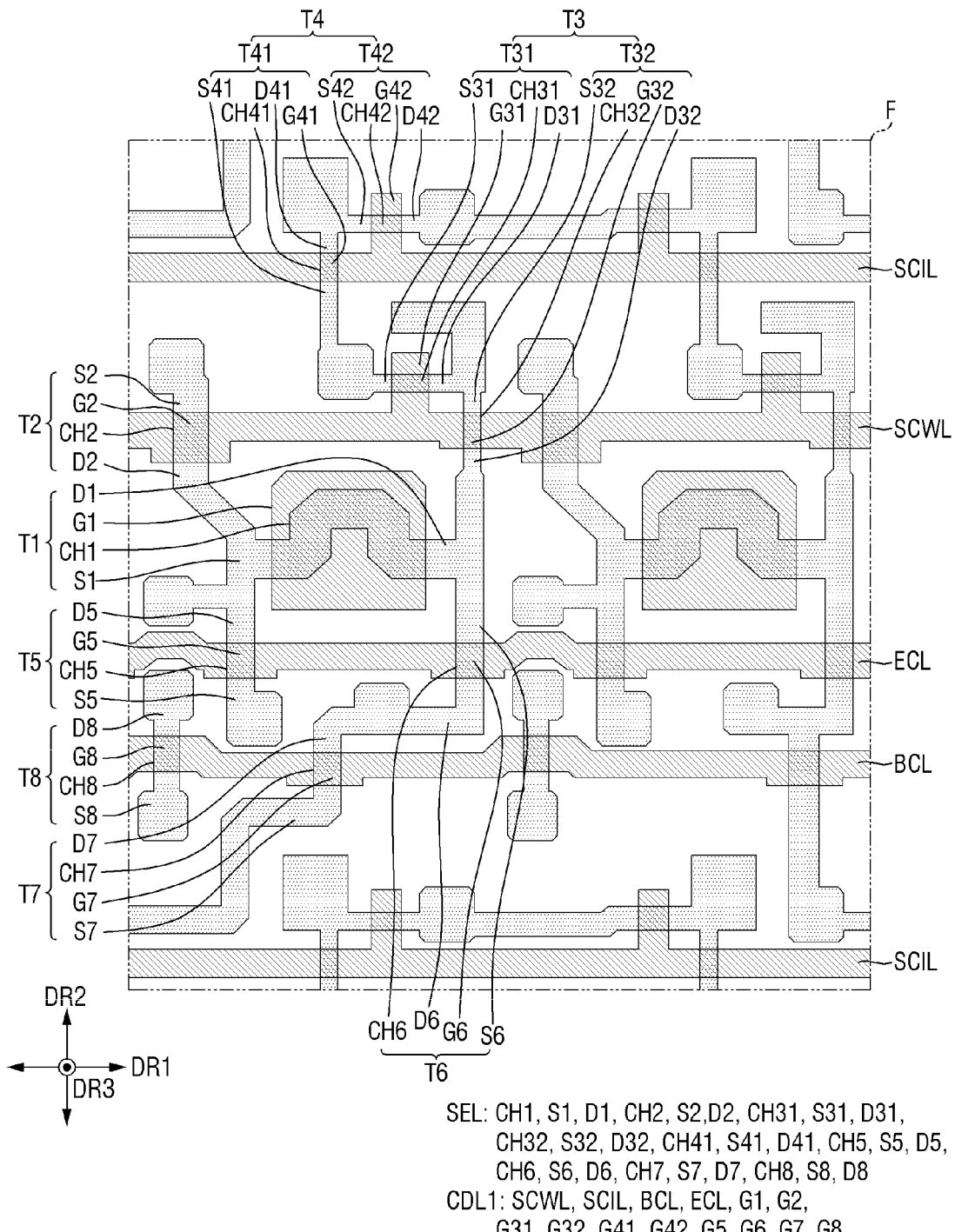
FIG. 9 is a plan view illustrating a semiconductor layer and a first conductive layer of FIG. 8.
Figure 10:
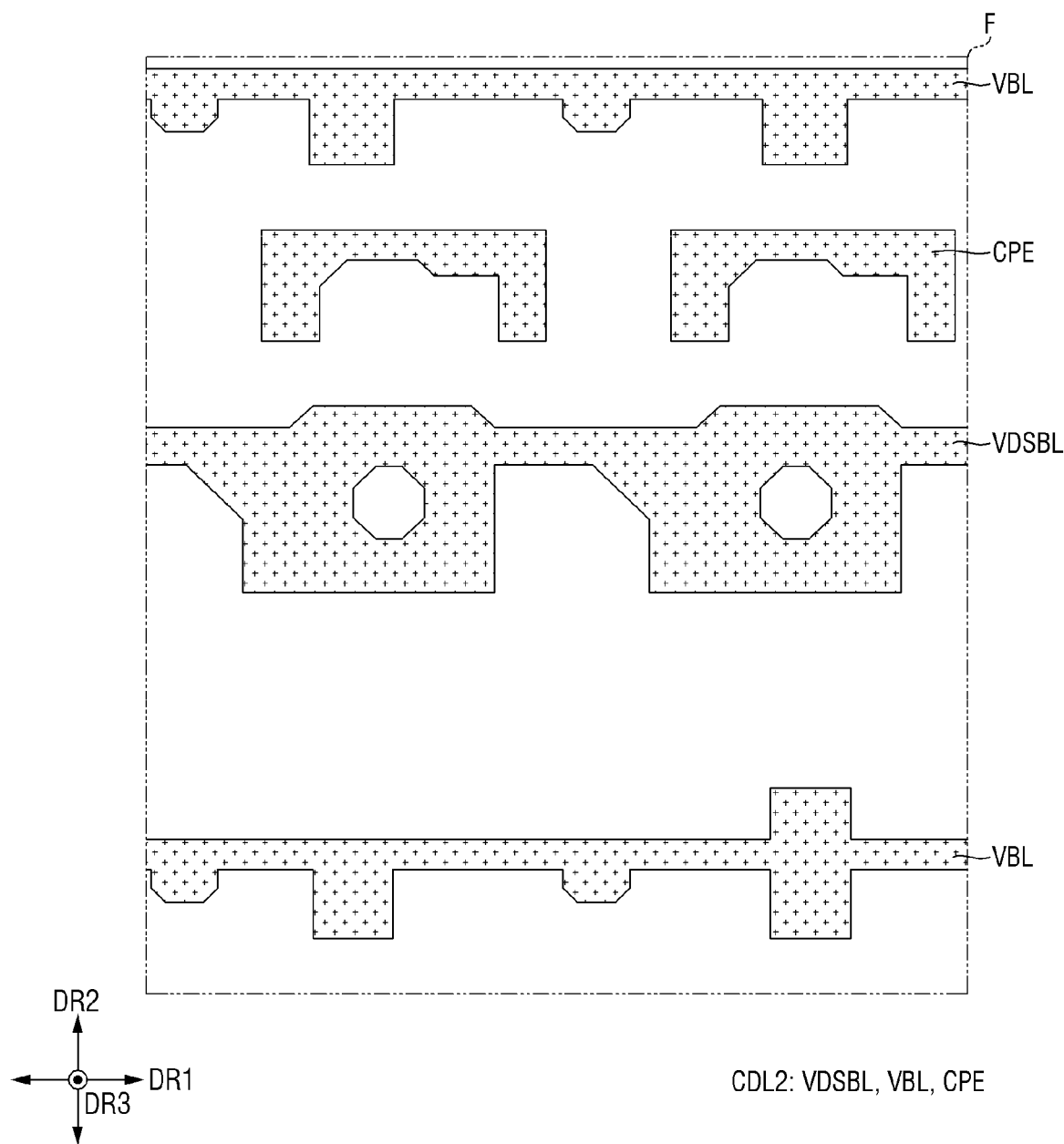
FIG. 10 is a plan view illustrating a second conductive layer of FIG. 8.
Figure 11:
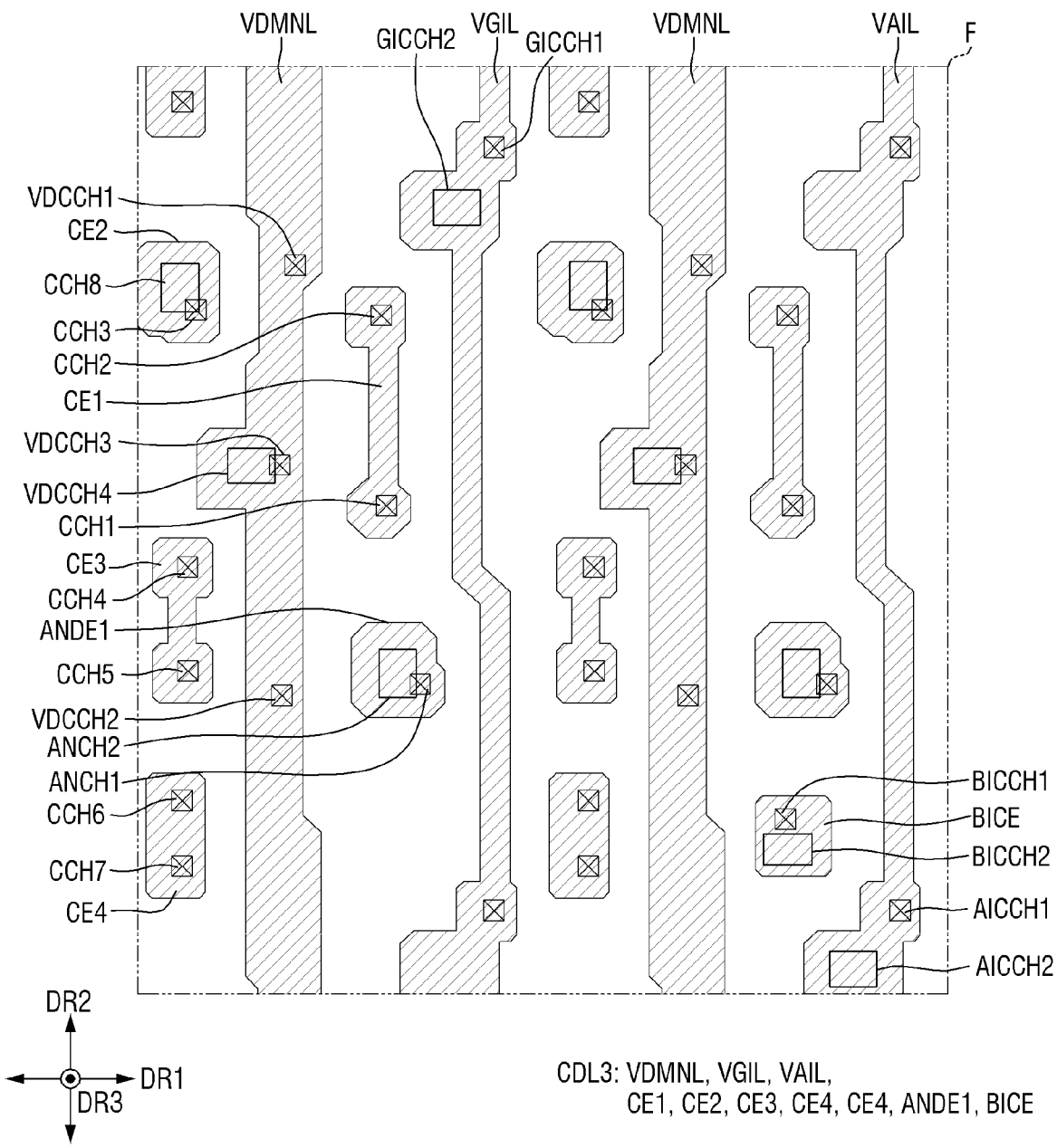
FIG. 11 is a plan view illustrating a third conductive layer of FIG. 8.
Figure 12:
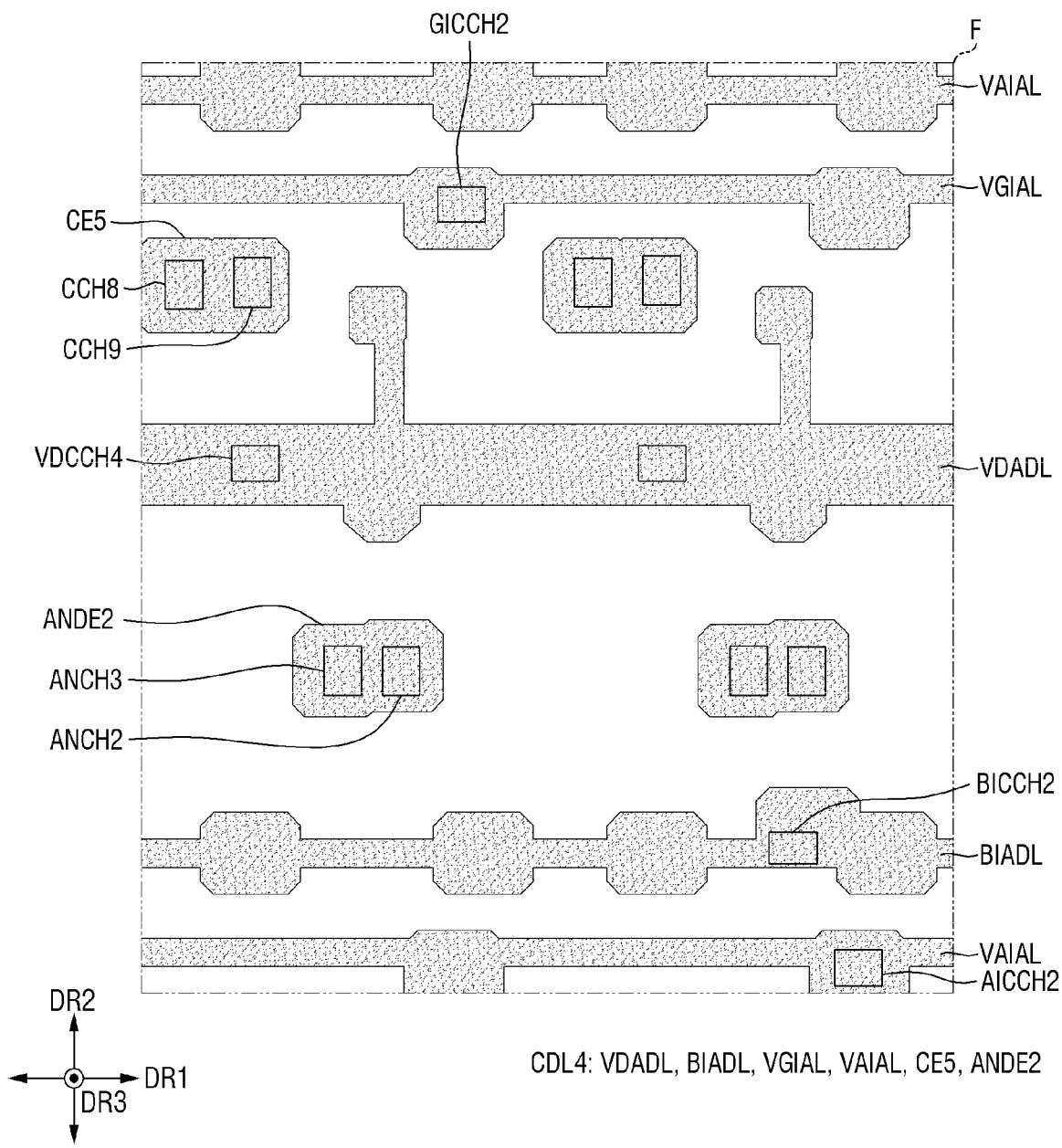
FIG. 12 is a plan view illustrating a fourth conductive layer of FIG. 8.
Figure 13:
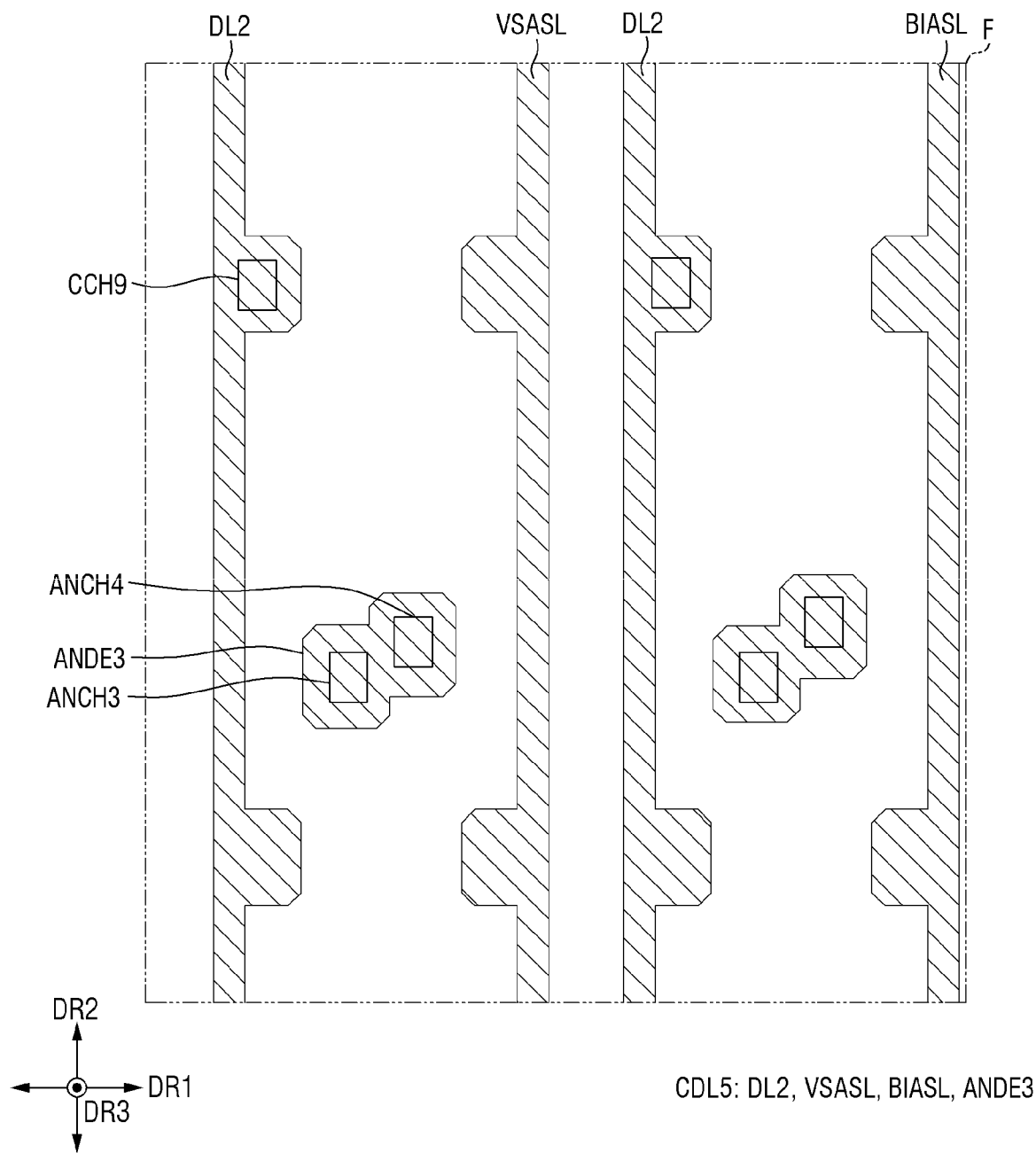
FIG. 13 is a plan view illustrating a fifth conductive layer of FIG. 8.

First, as shown in FIG. 14, the circuit array layer 120 may have a structure including the semiconductor layer SEL, e.g., see FIG. 9, on the substrate 110, the first conductive layer CDL1, e.g., see FIG. 9, on the first gate insulating layer 122 covering the semiconductor layer SEL, the second conductive layer CDL2, e.g., see FIG. 10, on the second gate insulating layer 123 covering the first conductive layer CDL1, the third conductive layer CDL3, e.g., see FIG. 11, on the interlayer insulating layer 124 covering the second conductive layer CDL2, the fourth conductive layer CDL4, e.g., see FIG. 12, on the first planarization layer 125 covering the third conductive layer CDL3, and the fifth conductive layer CDL5, e.g., see FIG. 13, on the second planarization layer 126 covering the fourth conductive layer CDL4.

The circuit array layer 120 may further include a buffer layer 121 covering one surface of the substrate 110 and, in this case, the semiconductor layer SEL may be disposed on the buffer layer 121.

Each of the buffer layer 121, the first gate insulating layer 122, the second gate insulating layer 123, and the interlayer insulating layer 124 may be formed of at least one inorganic layer. For example, each of the buffer layer 121, the first gate insulating layer 122, the second gate insulating layer 123, and the interlayer insulating layer 124 may be formed of multiple layers in which one or more inorganic layers of a silicon nitride layer, a silicon oxynitride layer, a silicon oxide layer, a titanium oxide layer, and an aluminum oxide layer are alternately stacked.

Each of the first planarization layer 125, the second planarization layer 126, and the third planarization layer 127 may be formed of an organic layer such as acryl resin, epoxy resin, phenolic resin, polyamide resin, polyimide resin, or the like.

Referring to FIG. 9, the semiconductor layer SEL may include channels CH1, CH2, CH31, CH32, CH41, CH42, CH5, CH6, CH7, and CH8, source electrodes S1, S2, S31, S32, S41, S42, S5, S6, S7, and S8, and drain electrodes D1, D2, D31, D32, D41, D42, D5, D6, D7, and D8 of the first, second, third, fourth, fifth, sixth, seventh and eighth transistors T1 to T8, respectively.

The semiconductor layer SEL may be formed of any one of polysilicon, amorphous silicon, and an oxide semiconductor.

Parts of the semiconductor layer SEL that overlap the first conductive layer CDL1, that is, parts other than the channels CH1, CH2, CH31, CH32, CH41, CH42, CH5, CH6, CH7, and CH8 may become conductive.

The first conductive layer CDL1 may include a first gate electrode G1, the scan write line SCWL, the scan initialization line SCIL, the emission control line ECL, and the bias control line BCL.

The first conductive layer CDL1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A second gate electrode G2, a first sub-gate electrode G31, and a second sub-gate electrode G32 may be different parts of the scan write line SCWL.

A third sub-gate electrode G41 and a fourth sub-gate electrode G42 may be different parts of the scan initialization line SCIL.

A fifth gate electrode G5 and a sixth gate electrode G6 may be different parts of the emission control line ECL.

A seventh gate electrode G7 and an eighth gate electrode G8 may be different parts of the bias control line BCL.

The first channel CH1 overlaps the first gate electrode G1, and both ends of the first channel CH1 are connected to the first source electrode S1 and the first drain electrode D1.

The first source electrode S1 may be connected to the second drain electrode D2 and the fifth drain electrode D5.

The first drain electrode D1 may be connected to the second sub-drain electrode D32 and the sixth drain electrode D6.

The first transistor T1 may include the first channel CH1, the first source electrode S1, the first drain electrode D1, and the first gate electrode G1.

The second channel CH2 overlaps the second gate electrode G2 that is a part of the scan write line SCWL, and both ends of the second channel CH2 are connected to the second source electrode S2 and the second drain electrode D2.

The second transistor T2 may include the second channel CH2, the second source electrode S2, the second drain electrode D2, and the second gate electrode G2.

The first sub-channel CH31 overlaps the first sub-gate electrode G31 that is a part of the scan write line SCWL, and both ends of the first sub-channel CH31 are connected to the first sub-source electrode S31 and the first sub-source electrode S31.

The first sub-source electrode S31 may be connected to the third sub-source electrode S41.

The first sub-drain electrode D31 may be connected to the second sub-source electrode S32.

The second sub-channel CH32 overlaps the second sub-gate electrode G32 that is a part of the scan write line SCWL, and both ends of the second sub-channel CH32 are connected to the second sub-source electrode S32 and the second sub-drain electrode D32.

The first sub-transistor T31 may include the first sub-channel CH31, the first sub-source electrode S31, the first sub-drain electrode D31, and the first sub-gate electrode G31.

The second sub-transistor T32 may include the second sub-channel CH32, the second sub-source electrode S32, the second sub-drain electrode D32, and the second sub-gate electrode G32.

The third transistor T3 may include the first sub-transistor T31 and the second sub-transistor T32.

The third sub-channel CH41 overlaps the third sub-gate electrode G41 that is a part of the scan initialization line SCIL, and both ends of the third sub-channel CH41 are connected to the third sub-source electrode S41 and the third sub-drain electrode D41.

The third sub-drain electrode D41 may be connected to the fourth sub-source electrode S42.

The fourth sub-channel CH42 overlaps the fourth sub-gate electrode G42 that is a part of the scan initialization line SCIL, and both ends of the fourth sub-channel CH42 are connected to the fourth sub-source electrode S42 and the fourth sub-drain electrode D42.

The third sub-transistor T41 may include the third sub-channel CH41, the third sub-source electrode S41, the third sub-drain electrode D41, and the third sub-gate electrode G41.

The fourth sub-transistor T42 may include the fourth sub-channel CH42, the fourth sub-source electrode S42, the fourth sub-drain electrode D42, and the fourth sub-gate electrode G42.

The fourth transistor T4 may include the third sub-transistor T41 and the fourth sub-transistor T42.

The fifth channel CH5 overlaps the fifth gate electrode G5 that is a part of the emission control line ECL, and both ends of the fifth channel CH5 are connected to the fifth source electrode S5 and the fifth drain electrode D5.

The fifth transistor T5 may include the fifth channel CH5, the fifth source electrode S5, the fifth drain electrode D5, and the fifth gate electrode G5.

The sixth channel CH6 overlaps the sixth gate electrode G6 that is a part of the emission control line ECL, and both ends of the sixth channel CH6 are connected to the sixth source electrode S6 and the sixth drain electrode D6.

The sixth drain electrode D6 may be connected to the seventh drain electrode D7.

The sixth transistor T6 may include the sixth channel CH6, the sixth source electrode S6, the sixth drain electrode D6, and the sixth gate electrode G6.

The seventh channel CH7 overlaps the seventh gate electrode G7 that is a part of the bias control line BCL, and both ends of the seventh channel CH7 are connected to the seventh source electrode S7 and the seventh drain electrode D7.

The seventh transistor T7 may include the seventh channel CH7, the seventh source electrode S7, the seventh drain electrode D7, and the seventh gate electrode G7.

The eighth channel CH8 overlaps the eighth gate electrode G8 that is a part of the bias control line BCL, and both ends of the eighth channel CH8 are connected to the eighth source electrode S8 and the eighth drain electrode D8.

The eighth transistor T8 may include the eighth channel CH8, the eighth source electrode S8, the eighth drain electrode D8, and the eighth gate electrode G8.

Referring to FIG. 10, the second conductive layer CDL2 may include the first power sub-line VDSBL and the bias line VBL extending in a first direction DR1, and a capacitor auxiliary electrode CPE.

The second conductive layer CDL2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A part of the first power sub-line VDSBL may overlap the first gate electrode G1.

Accordingly, the first capacitor PC1 may be provided by the overlapping area between the first power sub-line VDSBL and the first gate electrode G1.

The capacitor auxiliary electrode CPE may overlap the first sub-drain electrode D31 and the second sub-source electrode S32.

That is, the second capacitor PC2 may be provided by the overlapping area between the capacitor auxiliary electrode CPE and the first sub-drain electrode D31 and the second sub-source electrode S32.

A part of the bias line VBL may overlap the third sub-drain electrode D41 and the fourth sub-source electrode S42.

Accordingly, the third capacitor PC3 may be provided by the overlapping area between the bias line VBL and the third sub-drain electrode D41 and the fourth sub-source electrode S42.

Referring to FIG. 11, the third conductive layer CDL3 may include the first power main line VDMNL, the gate initialization voltage line VGIL, the anode initialization voltage line VAIL, a first connection electrode CE1, a second connection electrode CE2, a third connection electrode CE3, a fourth connection electrode CE4, a first anode connection electrode ANDE1, and a bias connection electrode BICE.

The third conductive layer CDL3 may have a multilayer structure in which a main metal layer (not shown) having low resistance characteristics and at least one cover metal layer (not shown) in contact with at least one surface of the main metal layer are stacked. The main metal layer may be formed of at least one low-resistance metal among aluminum (Al), chromium (Cr), gold (Au), nickel (Ni), neodymium (Nd), and copper (Cu). The cover metal layer may be formed of titanium (Ti). However, this is only an example, and the third conductive layer CDL3 of one embodiment is not limited thereto and may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first power main line VDMNL, the gate initialization voltage line VGIL, and the anode initialization voltage line VAIL extend in the second direction DR2.

The first power main line VDMNL may be electrically connected to the capacitor auxiliary electrode CPE through a first wiring connection contact hole VDCCH1.

The first power main line VDMNL may be electrically connected to the fifth source electrode D5 through a second wiring connection contact hole VDCCH2.

The first power main line VDMNL may be electrically connected to the first power sub-line VDSBL through a third wiring connection contact hole VDCCH3.

Each of the first wiring connection contact hole VDCCH1 and the second wiring connection contact hole VDCCH2 may penetrate and extend through the interlayer insulating layer 124.

The third wiring connection contact hole VDCCH3 may penetrate and extend through the interlayer insulating layer 124, the second gate insulating layer 123, and the first gate insulating layer 122.

The gate initialization voltage line VGIL may be electrically connected to the fourth sub-drain electrode D42 through a first gate initialization connection contact hole GICCH1.

The first gate initialization connection contact hole GICCH1 may penetrate and extend through the interlayer insulating layer 124, the second gate insulating layer 123, and the first gate insulating layer 122.

The anode initialization voltage line VAIL may be electrically connected to the seventh source electrode S7 through a first anode initialization connection contact hole AICCH1.

The first anode initialization connection contact hole AICCH1 may penetrate and extend through the interlayer insulating layer 124, the second gate insulating layer 123, and the first gate insulating layer 122.

The first connection electrode CE1 may be electrically connected to the first gate electrode G1 through a first electrode connection contact hole CCH1, and may be electrically connected to the first sub-source electrode S31 and the third sub-source electrode S41 through a second electrode connection contact hole CCH2.

The first electrode connection contact hole CCH1 may penetrate and extend through the interlayer insulating layer 124 and the second gate insulating layer 123.

The second electrode connection contact hole CCH2 may penetrate and extend through the interlayer insulating layer 124, the second gate insulating layer 123, and the first gate insulating layer 122.

The second connection electrode CE2 may be electrically connected to the second source electrode S2 through a third electrode connection contact hole CCH3.

The third electrode connection contact hole CCH3 may penetrate and extend through the interlayer insulating layer 124, the second gate insulating layer 123, and the first gate insulating layer 122.

The third connection electrode CE3 may be electrically connected to the first source electrode S1, the second drain electrode D2, and the fifth drain electrode D5 through a fourth electrode connection contact hole CCH4, and may be electrically connected to the eighth drain electrode D8 through a fifth electrode connection contact hole CCH5.

Each of the fourth electrode connection contact hole CCH4 and the fifth electrode connection contact hole CCH5 may penetrate and extend through the interlayer insulating layer 124, the second gate insulating layer 123, and the first gate insulating layer 122.

The fourth connection electrode CE4 may be electrically connected to the eighth source electrode S8 through a sixth electrode connection contact hole CCH6, and may be electrically connected to the bias line VBL through a seventh electrode connection contact hole CCH7.

The sixth electrode connection contact hole CCH6 may penetrate and extend through the interlayer insulating layer 124, the second gate insulating layer 123, and the first gate insulating layer 122.

The seventh electrode connection contact hole CCH7 may penetrate and extend through the interlayer insulating layer 124.

Accordingly, the eighth source electrode S8 may be electrically connected to the bias line VBL through the fourth connection electrode CE4.

The first anode connection electrode ANDE1 may be electrically connected to the sixth drain electrode D6 and the seventh drain electrode D7 through a first anode contact hole ANCH1.

The first anode contact hole ANCH1 may penetrate and extend through the interlayer insulating layer 124, the second gate insulating layer 123, and the first gate insulating layer 122.

The bias connection electrode BICE may be electrically connected to the bias line VBL through a first bias connection contact hole BICCH1.

The first bias connection contact hole BICCH1 may penetrate and extend through the interlayer insulating layer 124.

Referring to FIG. 12, the fourth conductive layer CDL4 may include the first power additional line VDADL, the bias additional line BIADL, the gate initialization voltage additional line VGIAL, the anode initialization voltage additional line VAIAL, the fifth connection electrode CE5, and the second anode connection electrode ANDE2.

Similarly to the third conductive layer CDL3, the fourth conductive layer CDL4 may have a multilayer structure in which a main metal layer (not shown) having low resistance characteristics and at least one cover metal layer (not shown) in contact with at least one surface of the main metal layer are stacked. The main metal layer may be formed of at least one low-resistance metal among aluminum (Al), chromium (Cr), gold (Au), nickel (Ni), neodymium (Nd), and copper (Cu). The cover metal layer may be formed of titanium (Ti). However, this is only an example, and the fourth conductive layer CDL4 of one embodiment is not limited thereto and may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

Each of the first power additional line VDADL, the bias additional line BIADL, the gate initialization voltage additional line VGIAL, and the anode initialization voltage additional line VAIAL may extend in the first direction DR1.

The first power additional line VDADL may be electrically connected to the first power main line VDMNL through a fourth wiring connection contact hole VDCCH4 penetrating and extending through the first planarization layer 125.

The gate initialization voltage additional line VGIAL may be electrically connected to the gate initialization voltage line VGIL through a second gate initialization connection contact hole GICCH2 penetrating and extending through the first planarization layer 125.

The anode initialization voltage additional line VAIAL may be electrically connected to the anode initialization voltage line VAIL through a second anode initialization connection contact hole AICCH2 penetrating and extending through the first planarization layer 125.

The bias additional line BIADL may be electrically connected to the bias connection electrode BICE through a second bias connection contact hole BICCH2 penetrating and extending through the first planarization layer 125.

Accordingly, the bias additional line BIADL may be electrically connected to the bias line VBL through the bias connection electrode BICE.

The fifth connection electrode CE5 may be electrically connected to the second connection electrode CE2 through an eighth electrode connection contact hole CCH8 penetrating and extending through the first planarization layer 125.

The second anode connection electrode ANDE2 may be electrically connected to the first anode connection electrode ANDE1 through a second anode contact hole ANCH2 penetrating and extending through the first planarization layer 125.

Referring to FIG. 13, the fifth conductive layer CDL5 may include the second data line DL2, the second power auxiliary line VSASL, the bias auxiliary line BIASL, and the third anode connection electrode ANDE3.

Similarly to the third conductive layer CDL3, the fifth conductive layer CDL5 may have a multilayer structure in which a main metal layer (not shown) having low resistance characteristics and at least one cover metal layer (not shown) in contact with at least one surface of the main metal layer are stacked. The main metal layer may be formed of at least one low-resistance metal among aluminum (Al), chromium (Cr), gold (Au), nickel (Ni), neodymium (Nd), and copper (Cu). The cover metal layer may be formed of titanium (Ti). However, this is only an example, and the fifth conductive layer CDL5 of one embodiment is not limited thereto and may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

Each of the second data line DL2, the second power auxiliary line VSASL, and the bias auxiliary line BIASL may extend in the second direction DR2.

The second data line DL2 may be electrically connected to the fifth connection electrode CE5 through a ninth electrode connection contact hole CCH9 penetrating and extending through the second planarization layer 126.

Accordingly, the second source electrode S2 may be electrically connected to the second data line DL2 through the second connection electrode CE2 and the fifth connection electrode CE5.

In addition, although not separately illustrated, the bias auxiliary line BIASL may be electrically connected to the bias connection electrode BICE through a contact hole (not shown) penetrating and extending through the first planarization layer 125 and the second planarization layer 126.

The third anode connection electrode ANDE3 may be electrically connected to the second anode connection electrode ANDE2 through a third anode contact hole ANCH3 penetrating and extending through the second planarization layer 126.

Referring to FIG. 14, the circuit array layer 120 may have a structure that further includes the third planarization layer 127 covering the fifth conductive layer CDL5.

The light emitting array layer 130 may be disposed on the third planarization layer 127.

The light emitting array layer 130 may include the anode electrode 131 disposed on the third planarization layer 127 and corresponding to the emission area EA, the pixel defining layer 132 disposed on the third planarization layer 127 and corresponding to the non-emission area NEA which is a separation region between the emission areas EA, the light emitting layer 133 disposed on the anode electrode 131, and the cathode electrode 134 disposed on the pixel defining layer 132 and the light emitting layer 133.

The anode electrode 131 may be electrically connected to the third anode connection electrode ANDE3 through a fourth anode contact hole ANCH4 penetrating and extending through the third planarization layer 127.

Accordingly, the sixth drain electrode D6 and the seventh drain electrode D7 may be electrically connected to the anode electrode 131 through the first anode connection electrode ANDE1, the second anode connection electrode ANDE2, and the third anode connection electrode ANDE3.

The light emitting array layer 130 is covered with the sealing layer 140.

Meanwhile, FIGS. 8 to 14 illustrate a portion of the first side region SDA1 in which the bias auxiliary line BIASL and the bias additional line BIADL intersect.

The portion of the first side region SDA1 in which the second power auxiliary line VSASL and the second power additional line VSADL intersect is substantially similar to that illustrated in FIGS. 8 to 14 except that the second power auxiliary line VSASL is disposed instead of the bias auxiliary line BIASL, and the second power additional line VSADL is disposed instead of the bias additional line BIADL, so that the redundant description thereof will be omitted.

Further, the portion of the first side region SDA1 in which the first data detour line DETL1 and the second data detour line DETL2 intersect is substantially similar to that illustrated in FIGS. 8 to 14 except that the first data detour line DETL1 is disposed instead of the bias auxiliary line BIASL, and the second data detour line DETL2 is disposed instead of the bias additional line BIADL, so that the redundant description thereof will be omitted.

In addition, FIGS. 8 to 14 illustrate a part of the first side region SDA1.

The pixel driver PXD disposed in a part of the second side region SDA2 may be substantially similar to that illustrated in FIGS. 8 to 14 except that the third data line DL3 is disposed instead of the second data line DL2, so that the redundant description thereof will be omitted.

Further, the pixel driver PXD disposed in the middle region MDDA is substantially similar to that illustrated in FIGS. 8 to 14 except that the first data line DL1 is disposed instead of the second data line DL2, so that the redundant description thereof will be omitted.

Figure 15:
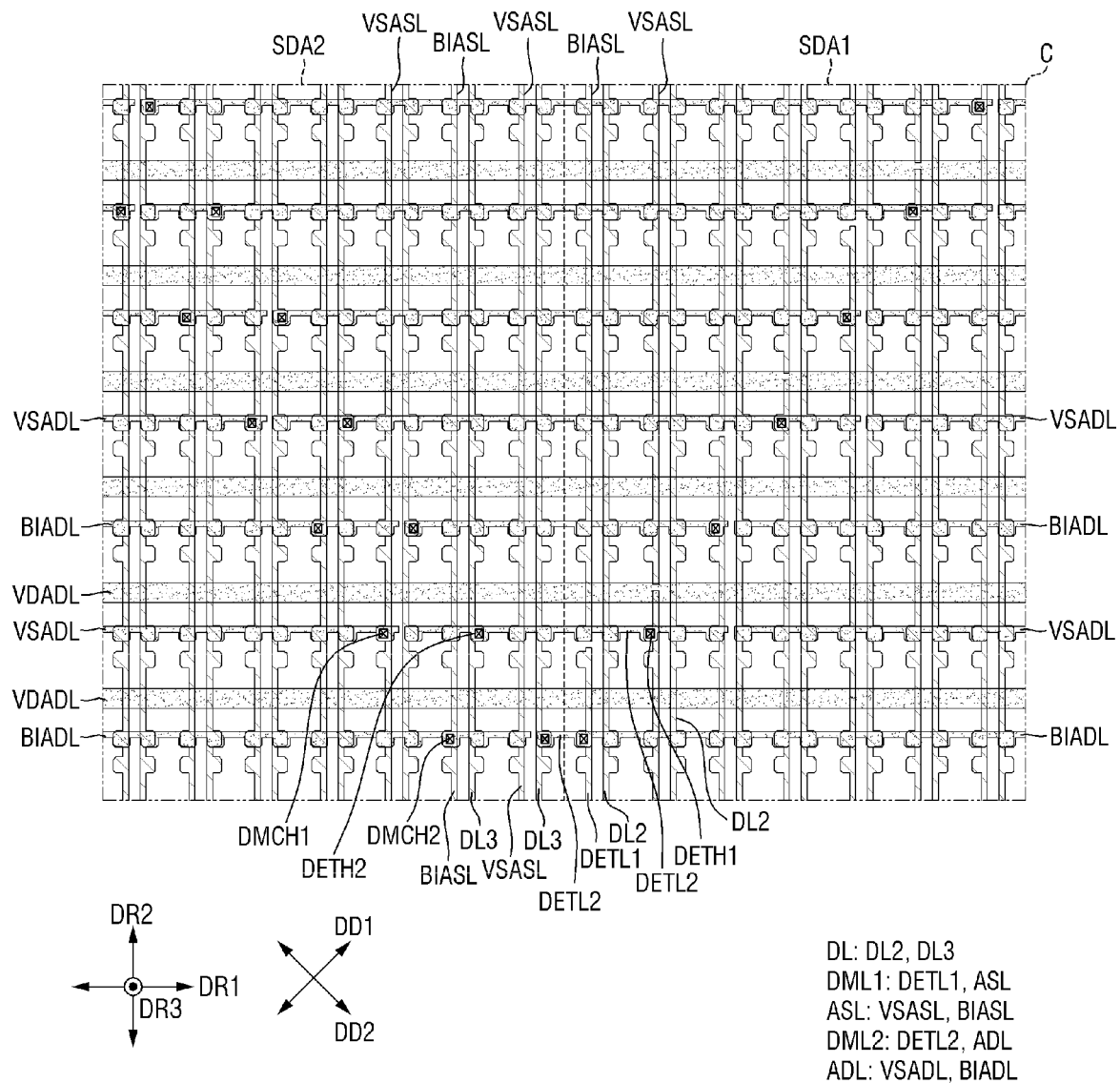
FIG. 15 is a plan view illustrating a fourth conductive layer and a fifth conductive layer in part C of FIG. 4.

FIG. 15 is a plan view illustrating a fourth conductive layer and a fifth conductive layer in area C of FIG. 4.

Referring to FIG. 15, the first dummy line DML1 and the data line DL may be formed as the fifth conductive layer CDL5, and the first dummy line DML1 and the data line DL may be alternately disposed in the first direction DR1 and arranged to be adjacent to each other in pairs. The first dummy line DML1 and the data line DL adjacent to each other may be symmetrical to each other.

The first dummy line DML1 includes the first data detour line DETL1 and the auxiliary lines ASL, and the auxiliary lines ASL include the second power auxiliary line VSASL and the bias auxiliary line BIASL.

At least one second power auxiliary line VSASL and at least one bias auxiliary line BIASL may be alternately disposed in the first direction DR1.

The second dummy line DML2 and the first power additional line VDADL may be formed as the fourth conductive layer CDL4, and the second dummy line DML2 and the first power additional line VDADL may be alternately disposed in the second direction DR2.

The second dummy line DML2 includes the second data detour line DETL2 and the additional lines ADL, and the additional lines ADL include the second power additional line VSADL and the bias additional line BIADL.

At least one second power additional line VSADL and at least one bias additional line BIADL may be alternately disposed in the second direction DR2.

The second data detour line DETL2 may be electrically connected to the first data detour line DETL1 through a first detour contact hole DETH1, and may be electrically connected to the third data line DL3 through a second detour contact hole DETH2.

Each of the first detour contact hole DETH1 and the second detour contact hole DETH2 may penetrate and extend through the second planarization layer 126.

Here, the first detour contact holes DETH1 corresponding to one ends of the second data detour lines DETL2 arranged in the second direction DR2 may be arranged side by side in a predetermined first diagonal direction DD1 intersecting the first direction DR1 and the second direction DR2 in the first side region SDA1.

Further, the second detour contact holes DETH2 corresponding to the other ends of the second data detour lines DETL2 arranged in the second direction DR2 may be arranged side by side in a second diagonal direction DD2 different from the first diagonal direction DD1 and intersecting the first direction DR1 and the second direction DR2 in the second side region SDA2.

For example, the arrangement direction of the first detour contact holes DETH1 and the arrangement direction of the second detour contact holes DETH2 may be symmetrical to each other.

In this way, whether the first detour contact holes DETH1 and the second detour contact holes DETH2 are normally arranged may be easily inferred from the arrangement pattern of the first detour contact holes DETH1 and the arrangement pattern of the second detour contact holes DETH2.

The second power additional line VSADL may be electrically connected to the second power auxiliary line VSASL through a first dummy contact hole DMCH1 penetrating and extending through the second planarization layer 126.

Further, the bias additional line BIADL may be electrically connected to the bias auxiliary line BIASL through a second dummy contact hole DMCH2 penetrating and extending through the second planarization layer 126.

Here, at one ends of the second dummy lines DML2 arranged in the second direction DR2, the first dummy contact holes DMCH1 and the second dummy contact holes DMCH2 may be alternately arranged side by side in the first diagonal direction DD1 or the second diagonal direction DD2.

In this way, whether the first dummy contact hole DMCH1 and the second dummy contact hole DMCH2 are normally arranged may be easily inferred from the arrangement pattern of the first dummy contact hole DMCH1 and the second dummy contact hole DMCH2.

Figure 16:
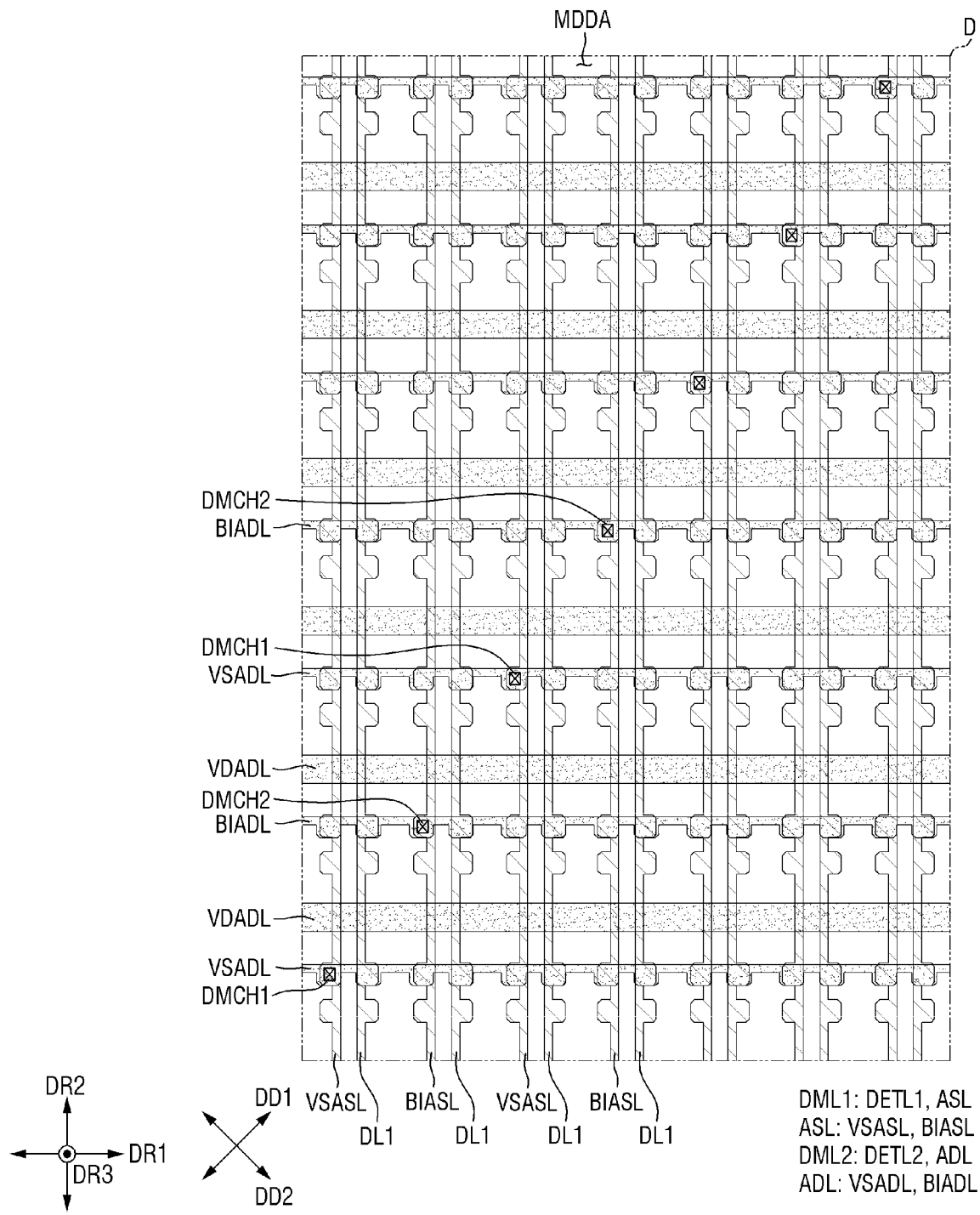
FIG. 16 is a plan view illustrating a fourth conductive layer and a fifth conductive layer in part D of FIG. 4.

FIG. 16 is a plan view illustrating a fourth conductive layer and a fifth conductive layer in area D of FIG. 4.

Referring to FIG. 16, the middle region MDDA is substantially similar to the first side region SDA1 and the second side region SDA2 except that the first data line DL1 is disposed instead of the second data line DL2 and the third data line DL3, and the first data detour line DETL1 and the second data detour line DETL2 are not disposed, so that the redundant description thereof will be omitted.

Figure 17:
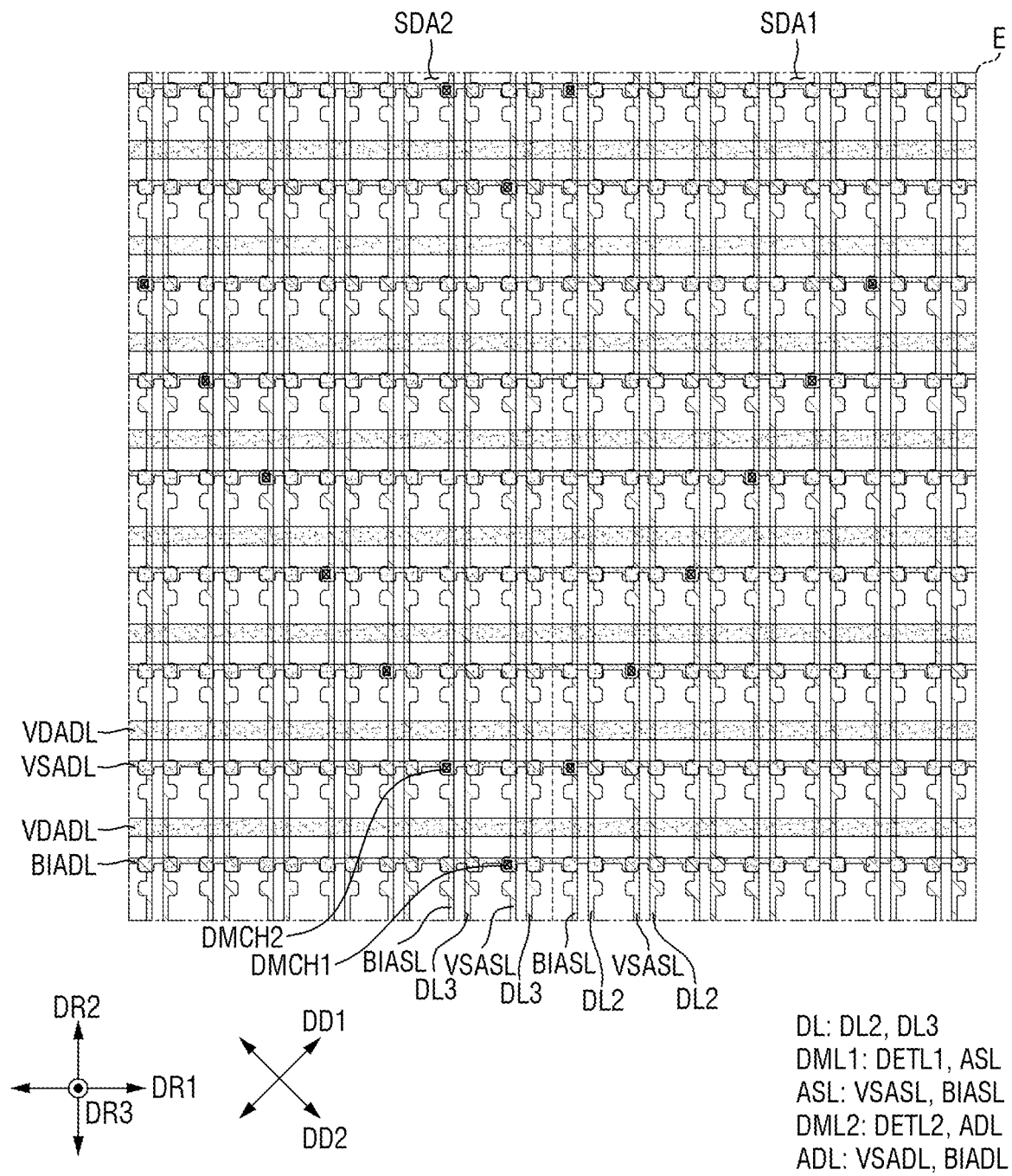
FIG. 17 is a plan view illustrating a fourth conductive layer and a fifth conductive layer in part E of FIG. 4.

FIG. 17 is a plan view illustrating a fourth conductive layer and a fifth conductive layer in area E of FIG. 4.

Referring to FIGS. 15 and 17, the first side region SDA1 and the second side region SDA2 disposed between one side of the middle region MDDA and the non-display area NDA are symmetrical with the first side region SDA1 and the second side region SDA2 disposed between the other side of the middle region MDDA and the non-display area NDA with respect to the middle region MDDA, so that the redundant description thereof will be omitted.

As described above, in accordance with one embodiment, except a part of each of the first side region SDA1 and the second side region SDA2 in which the first data detour line DETL1 and the second data detour line DETL2 are disposed, the second power auxiliary line VSASL, the second power additional line VSADL, the bias auxiliary line BIASL, and the bias additional line BIADL may be entirely disposed in the display area DA.

Accordingly, the wiring resistance of each of the second power line VSL and the bias line VBL according to the distance from the sub-region SBA may be lowered, so that the RC delay of each of the second power ELVSS and the bias power Vbias may be reduced. Accordingly, the display quality of the display device 10 may be improved.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:

1. A display device comprising:
a substrate;
a circuit array layer disposed on the substrate; and
a light emitting array layer disposed on the circuit array layer,
wherein
the substrate comprises a display area in which a plurality of emission areas is arranged, and a non-display area disposed around the display area,
the light emitting array layer comprises a plurality of light emitting elements respectively disposed on the plurality of emission areas, and
the circuit array layer comprises:
a plurality of pixel drivers electrically connected to the plurality of light emitting elements, respectively;
data lines configured to transmit data signals to the plurality of pixel drivers;
first dummy lines extending in the same direction as the data lines and adjacent to the data lines, and
second dummy lines extending in a first direction intersecting the data lines, and
wherein the data lines comprises:
a first data line;
a second data line adjacent to the non-display area than the first data line; and
a third data line adjacent to the non-display area than the second data line,
wherein the first dummy lines comprises:
a first data detour line adjacent to the second data line;
a bias auxiliary line to which a bias power is configured to be applied; and
a second power auxiliary line to which a second power is configured to be applied, and
wherein a first power and the second power are for driving the light emitting elements.

2. The display device of claim 1, wherein the second dummy lines comprise:
a second data detour line configured to electrically connect between the first data detour line and the third data line;
a bias additional line to which the bias power is configured to be applied; and
a second power additional line to which the second power is configured to be applied.

3. The display device of claim 2, wherein the circuit array layer further comprises first power additional lines extending in the first direction, and to which the first power is configured to be applied, and
the first power additional lines and the second dummy lines are alternately disposed.

4. The display device of claim 1, wherein at least one second power auxiliary line and at least one bias auxiliary line are alternately disposed in the first direction.

5. The display device of claim 2, wherein a first dummy line among the first dummy lines, is spaced apart side by side from the first data detour line adjacent in a second direction intersecting the first direction, and configured to be applied one of the bias power and the second power.

6. The display device of claim 2, wherein two second dummy lines among the second dummy lines, are spaced apart side by side on both sides of the second data detour line in the first direction, and configured to be applied one of the bias power and the second power.

7. The display device of claim 2, wherein the substrate comprises:
  a main region comprising the display area and the non-display area; and
  a sub-region protruding from one side of the main region,
  wherein the display area comprises a middle region adjacent to the sub-region in a second direction which is an extension direction of the data lines, a first side region in contact with the middle region in the first direction, and a second side region between the first side region and the non-display area,
  wherein the circuit array layer further comprises data supply lines electrically connected between the data lines and a display driving circuit disposed in the sub-region, respectively, and
  wherein the data supply lines extend from the display driving circuit to the middle region and the first side region.

8. The display device of claim 7, wherein
  the first data line is disposed in the middle region,
  the second data line and the first data detour line are disposed in the first side region,
  the third data line is disposed in the second side region,
  the data supply lines comprise a first data supply line extending to the middle region, and a second data supply line and a third data supply line extending to the first side region,
  the first data line is electrically connected to the first data supply line,
  the second data line is electrically connected to the second data supply line,
  the first data detour line is electrically connected to the third data supply line, and
  the third data line is electrically connected to the third data supply line through the first data detour line and the second data detour line.

9. The display device of claim 7, wherein the circuit array layer further comprises:
  a bias supply line extending from the sub-region to the non-display area and configured to transmit the bias power;
  a first power supply line extending from the sub-region to the non-display area and configured to transmit the first power; and
  a second power supply line extending from the sub-region to the non-display area and configured to transmit the second power,
  wherein the bias auxiliary line and the bias additional line are electrically connected to the bias supply line,
  the first power additional lines are electrically connected to the first power supply line, and
  the second power auxiliary line and the second power additional line are electrically connected to the second power supply line.

10. The display device of claim 9, wherein the circuit array layer is provided to include a structure comprising:
  a semiconductor layer on the substrate;
  a first conductive layer on a first gate insulating layer covering the semiconductor layer;
  a second conductive layer on a second gate insulating layer covering the first conductive layer;
  a third conductive layer on an interlayer insulating layer covering the second conductive layer;
  a fourth conductive layer on a first planarization layer covering the third conductive layer; and
  a fifth conductive layer on a second planarization layer covering the fourth conductive layer,
  wherein the data lines and the first dummy lines are included in the fifth conductive layer,
  the second dummy lines and the first power additional lines are included in the fourth conductive layer, and
  the second power auxiliary line is electrically connected to the second power additional line through a first dummy contact hole extending through the second planarization layer.

11. The display device of claim 10, wherein the circuit array layer further comprises a bias line included in the second conductive layer, configured to electrically connect the bias supply line to the plurality of pixel drivers, and extending in the first direction,
  the bias line is electrically connected to a bias connection electrode included in the third conductive layer through a first bias connection hole extending through the interlayer insulating layer,
  the bias additional line, which is a part of the second dummy lines, is electrically connected to the bias connection electrode through a second bias connection hole extending through the first planarization layer, and
  the bias auxiliary line is electrically connected to the bias additional line through a second dummy contact hole extending through the second planarization layer.

12. The display device of claim 2, wherein one light emitting element among a plurality of light emitting elements, is electrically connected between the second power and one pixel driver among the plurality of pixel drivers,
  wherein the one pixel driver comprises:
  a first transistor;
  a second transistor disposed between a first electrode of the first transistor and a data signal through one of the data lines;
  a third electrode disposed between a gate electrode of the first transistor and a second electrode of the first transistor;
  a fourth transistor disposed between the gate electrode of the first transistor and a gate initialization voltage line configured to transmit a first initialization voltage;
  a fifth transistor disposed between the first electrode of the first transistor and a first power line configured to transmit the first power;
  a sixth transistor disposed between the one light emitting element and the second electrode of the first transistor;
  a seventh transistor disposed between a second electrode of the sixth transistor and an anode initialization voltage line configured to transmit a second initialization voltage; and
  an eighth transistor disposed between the first electrode of the first transistor and a the bias line configured to transmit the bias voltage.

13. A display device comprising:
  a substrate;
  a circuit array layer disposed on the substrate; and
  a light emitting array layer disposed on the circuit array layer,
  wherein
  the substrate comprises a display area in which a plurality of emission areas is arranged, and a non-display area disposed around the display area,
  the light emitting array layer comprises a plurality of light emitting elements respectively disposed on the plurality of emission areas, and
  the circuit array layer comprises:
  a plurality of pixel drivers electrically connected to the plurality of light emitting elements, respectively;

data lines configured to transmit data signals to the plurality of pixel drivers;
first dummy lines extending in the same direction as the data lines and adjacent to the data lines, and
second dummy lines extending in a first direction intersecting the data lines, and
wherein the data lines comprises:
a first data line;
a second data line adjacent to the non-display area than the first data line; and
a third data line adjacent to the non-display area than the second data line,
wherein the first dummy lines comprises a first data detour line adjacent to the second data line,
wherein the second dummy lines comprise:
a second data detour line configured to electrically connect between the first data detour line and the third data line;
a bias additional line to which a bias power is configured to be applied; and
a second power additional line to which a second power is configured to be applied, and
wherein a first power and the second power are for driving the light emitting elements.

14. The display device of claim 13, wherein the first dummy lines further comprises:
a bias auxiliary line to which the bias power is configured to be applied; and
a second power auxiliary line to which the second power is configured to be applied.

15. The display device of claim 14, wherein the substrate comprises:
a main region comprising the display area and the non-display area; and
a sub-region protruding from one side of the main region,
wherein the display area comprises a middle region adjacent to the sub-region in a second direction which is an extension direction of the data lines, a first side region in contact with the middle region in the first direction, and a second side region between the first side region and the non-display area, and
wherein
the first data line is disposed in the middle region,
the second data line and the first data detour line are disposed in the first side region,
the third data line is disposed in the second side region.

16. The display device of claim 15, wherein the circuit array layer further comprises data supply lines electrically connected between the data lines and a display driving circuit disposed in the sub-region, respectively,
wherein the data supply lines extend from the display driving circuit to the middle region and the first side region,
wherein
a first data supply line among the data supply lines, is configured to transit data signal of the first data line and electrically connected to the first data line directly,
a second data supply line among the data supply lines, is configured to transit data signal of the second data line and electrically connected to the second data line directly, and
a third data supply line among the data supply lines, is configured to transit data signal of the third data line and electrically connected to the third data line through the first data detour line and the second data detour line.

17. The display device of claim 15, wherein the circuit array layer further comprises:
a bias supply line extending from the sub-region to the non-display area and configured to transmit the bias power;
a first power supply line extending from the sub-region to the non-display area and configured to transmit the first power; and
a second power supply line extending from the sub-region to the non-display area and configured to transmit the second power,
wherein the bias auxiliary line and the bias additional line are electrically connected to the bias supply line,
the first power additional lines are electrically connected to the first power supply line, and
the second power auxiliary line and the second power additional line are electrically connected to the second power supply line.

18. The display device of claim 14, wherein the second power auxiliary line is electrically connected to the second power additional line through a first dummy contact hole.

19. The display device of claim 14, wherein the bias auxiliary line is electrically connected to the bias additional line through a second dummy contact hole.

20. The display device of claim 13, wherein the circuit array layer further comprises first power additional lines extending in the first direction, and to which the first power is configured to be applied, and
the first power additional lines and the second dummy lines are alternately disposed.

* * * * *